United States Patent
Senda et al.

(10) Patent No.: US 6,535,441 B2
(45) Date of Patent: Mar. 18, 2003

(54) STATIC SEMICONDUCTOR MEMORY DEVICE CAPABLE OF ACCURATELY DETECTING FAILURE IN STANDBY MODE

(75) Inventors: Minoru Senda, Hyogo (JP); Shigeki Ohbayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/912,593

(22) Filed: Jul. 26, 2001

(65) Prior Publication Data

US 2002/0097617 A1 Jul. 25, 2002

(30) Foreign Application Priority Data

Jan. 23, 2001 (JP) ........................................ 2001-014042

(51) Int. Cl.$^7$ ................................................. G11C 7/00
(52) U.S. Cl. ..................................... 365/201; 365/233.5
(58) Field of Search ............................... 365/201, 233.5

(56) References Cited

U.S. PATENT DOCUMENTS

| | | | |
|---|---|---|---|
| 5,463,585 A | * 10/1995 | Sanada | ........................ 365/201 |
| 5,963,490 A | 10/1999 | Kawamura | .................... 365/201 |

FOREIGN PATENT DOCUMENTS

| | | | | |
|---|---|---|---|---|
| JP | 57-20991 A | * | 2/1982 | ............ G11C/11/34 |
| JP | 57-69584 A | * | 4/1982 | ............ G11C/11/34 |
| JP | 3-46193 | | 2/1991 | |
| JP | 5-101696 | | 4/1993 | |
| JP | 6-68694 | | 3/1994 | |
| JP | 11-185498 | | 7/1999 | |

OTHER PUBLICATIONS

Betty Prince, "Semiconductor Memories", 1983 Wiley 2$^{nd}$ edition, p. 716.*

* cited by examiner

*Primary Examiner*—Mike Tran
(74) *Attorney, Agent, or Firm*—McDermott, Will & Emery

(57) ABSTRACT

A voltage supply circuit has a resistive element, a p-channel MOS transistor, and n-channel MOS transistors. The resistive element and the p-channel MOS transistor are connected in parallel between a power source node and a node. The n-channel MOS transistors are connected in series between the node and the ground node. The voltage supply circuit supplies a threshold voltage of the n-channel MOS transistor to the node connected to a cell Vcc line of a memory cell in response to a test mode signal TE of the H level, and supplies an external source voltage in response to a test mode signal of the L level. In such a manner, a memory cell having an abnormal current in a standby mode can be detected by an operation test.

15 Claims, 13 Drawing Sheets

STATIC SEMICONDUCTOR MEMORY DEVICE CAPABLE OF ACCURATELY DETECTING FAILURE IN STANDBY MODE

BACKGROUND OF THE INVENTION

1. Field of the Invention

The present invention relates to a static semiconductor memory device capable of detecting a failure in a standby mode.

2. Description of the Background Art

Referring to FIG. 23, a static memory cell (SRAM (Static Random Access Memory)) 10 has p-channel MOS transistors 1 and 2, n-channel MOS transistors 3 to 6, and storage nodes N1 and N2. The p-channel MOS transistor 1 is connected between a power source node 35 and the storage node N1, and the p-channel MOS transistor 2 is connected between the power source node 35 and the storage node N2. The n-channel MOS transistor 3 is connected between the storage node N1 and a ground node 36, and the n-channel MOS transistor 4 is connected between the storage node N2 and the ground node 36. A voltage on the storage node N1 is applied to the gate terminals of the p-channel MOS transistor 2 and the n-channel MOS transistor 4, and a voltage on the storage node N2 is applied to the gate terminals of the p-channel MOS transistor 1 and the n-channel MOS transistor 3. The n-channel MOS transistor 5 is connected between the storage node N1 and a bit line BL, and the n-channel MOS transistor 6 is connected between the storage node N2 and a bit line /BL. The n-channel MOS transistors 5 and 6 are turned on/off by a word line (WL).

When the potential on the storage node N1 is at the H (logical high) level and that on the storage node N2 is at the L (logical low) level, the memory cell 10 stores data "1". When the potential on the storage node N1 is at the L level and that on the storage node N2 is at the H level, the memory cell 10 stores data "0".

When the data "1" is written in the memory cell 10, the potential on the bit line BL is held H level and the potential on the bit line /BL is held L level. When the word line (WL) is activated, the n-channel MOS transistors 5 and 6 are turned on, the potential on the storage node N1 goes H level which is the same as the potential on the bit line BL, and the potential on the storage node N2 goes L level which is the same as the potential on the bit line /BL. Accordingly, the p-channel MOS transistor 1 is turned on and the n-channel MOS transistor 3 is turned off, so that the potential on the storage node N1 is latched at the H level. The p-channel MOS transistor 2 is turned off and the n-channel MOS transistor 4 is turned off, so that the potential on the storage node N2 is latched at the L level. After that, when the word line (WL) is inactivated, the n-channel MOS transistors 5 and 6 are turned off, the potential on the storage node N1 is held H level, the potential on the storage node N2 is held L level, and the data "1" is written in the memory cell 10. When the data "0" is written in the memory cell 10, the potential on the bit line BL is held L level and the potential on the bit line /BL is held H level. The same writing operation as that in the case where the data "1" is written is performed.

In the case of reading the data "1" from the memory cell 10, by making the word line (WL) active, the n-channel MOS transistors 5 and 6 are turned on to make the memory cell 10 active. Since the potential on the storage node N1 is H level, the p-channel MOS transistor 2 is turned off, the n-channel MOS transistor 4 is turned on, a current flows from the bit line /BL to the ground node 36 via the n-channel MOS transistors 4 and 6, and the potential on the bit line /BL goes L level. The p-channel MOS transistor 1 is turned on and the n-channel MOS transistor 3 is turned off, so that the current flows from the power source node 35 to the bit line BL via the p-channel MOS transistor 1 and the n-channel MOS transistor 5, and the potential on the bit line BL goes H level.

The operation in the case of reading the data "0" from the memory cell 10 is the same as that in the case of reading the data "1".

As obviously understood from FIG. 23, the memory cell 10 is what is called a full CMOS (Complementary MOS) type SRAM constructed by six MOS transistors. Since a memory cell of this type is constructed only by MOS transistors, a path through which a direct current flows does not exist in a state where data is held. Only a very slight amount of current (the order of $10^{-15}$A) such as a sub-threshold current or junction leak current flows. In a memory cell of this type, therefore, a standby current of about 0.1 $\mu$A can be realized.

An operation test is conducted on the memory cell 10 before shipment. The operation test includes a test of writing/reading data to/from the memory cell 10 and a retention test. The writing/reading test is a test for determining whether the memory cell is good or not by writing predetermined data to the memory cell 10, reading the written data, and checking whether the read data coincides with the written data or not. The retention test is conducted after the writing/reading test, by holding a voltage to be applied to the memory cell 10 so as to be lower than an external source voltage in normal operation, after elapse of a predetermined time, reading the data from the memory cell 10, and checking whether the written data is retained or not, thereby determining whether the memory cell is good or not.

FIG. 24 shows the profile of a voltage applied to the memory cell 10 at the time of an operation test. During a period T1, 3.3V as an external power source voltage is applied to the memory cell 10 and the writing/reading test is carried out. During a period T2, a voltage applied to the memory cell 10 is lowered from 3.3V to a range from 1.0 to 1.5V and held. After that, during a period T3, 3.3V as the external source voltage is applied to the memory cell 10 and data is read.

When a foreign matter is adhered to the memory cell 10, however, as shown in FIG. 23, a leak current 91 flows between the power source node 35 and the storage node N2. When the storage node N1 is held H level and the storage node N2 is held L level, the p-channel MOS transistor 2 is turned off and the n-channel MOS transistor 4 is turned on. Consequently, an ON-state current 92 flows from the storage node N2 via the n-channel MOS transistor 4 to the ground node 36. In this case, even if the leak current 91 of a few $\mu$A flows due to a foreign matter, under normal operation conditions of applying an external source voltage of about 3.3V to memory cells, the ON-state current is 10 $\mu$A or larger, and the SRAM operates normally. However, a current in the standby mode is abnormal. In order to detect a memory cell having an abnormal current in a standby mode by an operation test, it is necessary to decrease the ON-state current of the n-channel MOS transistor 4 shown in FIG. 23 to 1 $\mu$A or lower. In order to set the ON-state current of the n-channel MOS transistor 4 to 1 $\mu$A or lower, a voltage applied to the power source node 35 of the memory cell 10 has to be set to about a threshold voltage Vth of the n-channel MOS transistor 4 at the time of the retention test.

It is, however, difficult to apply the voltage which is about the threshold voltage Vth from the outside to the memory cell due to an influence of temperature fluctuation or the like, and there is a problem such that a memory cell having an abnormal current in a standby mode due to a leak current cannot be detected.

SUMMARY OF THE INVENTION

An object of the invention is, therefore, to provide a static semiconductor memory device capable of detecting a memory cell having an abnormal current in a standby mode by an operation test.

A static semiconductor memory device according to the invention has: a plurality of static memory cells provided between a first node and a second node; a control terminal for receiving a control signal; a test mode signal generating circuit generating an activated test mode signal when a voltage level of the control signal is equal to or higher than a predetermined level and generating an inactivated test mode signal when the voltage level is lower than the predetermined level; and a voltage setting circuit setting a voltage between the first and second nodes as a test voltage in response to the activated test mode signal and setting a voltage between the first and second nodes as an external source voltage in response to the inactivated test mode signal. The test voltage lies in a range from 0V to a threshold voltage of a MOS transistor as a component of the memory cell.

In the static semiconductor memory device according to the invention, the external source voltage is applied across a memory cell in a normal operation mode, and a voltage in a range from 0V to the threshold voltage of the MOS transistor is applied across a memory cell in a test mode. According to the invention, therefore, a memory cell having an abnormal current in a standby mode can be detected by a data retaining test. According to the invention, the time of an operation test on the static semiconductor memory device can be shortened.

Preferably, the voltage setting circuit in the static semiconductor memory device includes: a voltage supply circuit supplying the threshold voltage to the first node in response to the activated test mode signal and supplying the external source voltage to the first node in response to the inactivated test mode signal; and a ground voltage supplying terminal supplying a ground voltage to the second node.

The voltage setting circuit supplies the threshold voltage or the external source voltage to the first node by the voltage supply circuit and supplies a ground voltage to the second node by the ground voltage supplying terminal, thereby setting the voltage across a memory cell as the external source voltage in a normal operation and setting the voltage across a memory cell as the threshold voltage in a test mode. By switching the voltage to be supplied to the cell Vcc line of the memory cell, a test capable of detecting a memory cell having an abnormal current in a standby mode can be conducted. A memory cell having an abnormal current in a standby mode can be detected in a short time.

Preferably, a MOS transistor as a component of the voltage supply circuit has the same shape and placement as those of a MOS transistor included in a memory cell.

By changing only an interconnection without changing the placement of the MOS transistor as a component of the memory cell, the voltage supply circuit is fabricated. According to the invention, therefore, the memory cells and the voltage supply circuit can be simultaneously fabricated by a process of fabricating the memory cells.

Preferably, the voltage supply circuit in the static semiconductor memory device is constructed by using a MOS transistor included in one of the plurality of memory cells.

By changing the interconnection of the MOS transistor as a component of one of the plurality of memory cells included in the static semiconductor memory device, the voltage supply circuit is fabricated. According to the invention, therefore, the voltage supply circuit for applying a voltage in a range from 0V to the threshold voltage across a memory cell in a test mode can be provided within the static semiconductor without increasing the area.

Preferably, the voltage supply circuit includes: a first MOS transistor of a first conduction type provided between an external power source node and the first node; second and third MOS transistors of a second conduction type connected in series between the first node and a ground node; and a resistive element connected in parallel with the first MOS transistor between the external source node and the first node. The first MOS transistor is turned off in response to the activated test mode signal and is turned on in response to the inactivated test mode signal, the second MOS transistor is connected as a diode between the first node and the third MOS transistor, and the third MOS transistor is turned on in response to the activated test mode signal and is turned off in response to the inactivated test mode signal.

The second MOS transistor supplies the threshold voltage to the first node in response to the activated test mode signal and the first MOS transistor supplies the external source voltage to the first node in response to the inactivated test mode. According to the invention, therefore, the voltage supply circuit can be fabricated by using a MOS transistor as a component of a memory cell. As a result, the threshold voltage can be stably supplied to the first node of the memory cell.

Preferably, the resistive element is either a resistor or a MOS transistor of a first conduction type of which resistance value in an ON state is larger than a resistance value in an ON state of the MOS transistor as a component of the memory cell.

A MOS transistor of the first conduction type or a resistor is fabricated as a resistive element in the same process as the process for fabricating memory cells, thereby forming the voltage supply circuit. According to the invention, therefore, when the MOS transistor of the first conduction type is used as a resistive element, the voltage supply circuit can be constructed only by MOS transistors. When the resistor is used as a resistive element, it is sufficient to form the resistor on the layers of the MOS transistors, so that the area occupied by the voltage supply circuit can be reduced.

Preferably, the voltage setting circuit in the static semiconductor memory device includes: a voltage supply circuit supplying a ground voltage to the first node in response to the activated test mode signal and supplying the external source voltage to the first node in response to the inactivated test mode signal, and a ground voltage supplying terminal supplying the ground voltage to the second node.

The voltage setting circuit supplies the ground voltage or the external source voltage to the first node by the voltage supply circuit and supplies the ground voltage to the second node of a memory cell by the ground voltage supplying terminal, thereby setting the voltage across the memory cell as the external source voltage in a normal operation node and setting the voltage across the memory cell as 0V in a test mode. By switching the voltage to be supplied to the cell Vcc line of a memory cell, therefore, a test capable of detecting a memory cell having an abnormal current in a standby mode can be conducted. A memory cell having an abnormal current in a standby mode can be detected in a short time.

Preferably, the voltage supply circuit in the static semiconductor memory device includes: a first MOS transistor of a first conduction type provided between an external source node and the first node; and a second MOS transistor of a second conduction type connected between the first node and a ground node. The first MOS transistor is turned off in response to the activated test mode signal and is turned on in response to the inactivated test mode signal, and the second MOS transistor is turned on in response to the activated test mode signal and is turned off in response to the inactivated test mode signal.

The second MOS transistor supplies the ground voltage to the first node in response to the activated test mode signal, and the first MOS transistor supplies the external source voltage to the first node in response to the inactivated test mode signal. According to the invention, therefore, the voltage supply circuit can be fabricated by using the MOS transistor as a component of a memory cell. As a result, the threshold voltage can be stably supplied to the first node of a memory cell in a test mode.

Preferably, the voltage setting circuit in the static semiconductor memory device includes: a source voltage supplying terminal supplying the external source voltage to the first node; and a voltage supply circuit supplying a voltage obtained by subtracting the threshold voltage from the external source voltage to the second node in response to the activated test mode signal and supplying a ground voltage to the second node in response to the inactivated test mode signal.

The voltage setting circuit supplies the external source voltage to the first node of a memory cell by the source voltage supplying terminal and supplies the ground voltage or a voltage obtained by subtracting the threshold voltage from the external source voltage to the second node by the voltage supply circuit, thereby setting the voltage across the memory cell as the external source voltage in a normal operation mode and setting the voltage across the memory cell as the threshold voltage in a test mode. By switching the voltage to be supplied to the cell GND line of a memory cell, therefore, a test capable of detecting a memory cell having an abnormal current in a standby mode can be conducted. A memory cell having an abnormal current in a standby mode can be detected in a short time.

Preferably, a MOS transistor as a component of the voltage supply circuit in the static semiconductor memory device has the same shape and placement as those of a MOS transistor included in a memory cell.

The voltage supply circuit is fabricated by changing only the interconnection without changing the placement of the MOS transistor as a component of a memory cell. According to the invention, therefore, the memory cells and the voltage supply circuit can be simultaneously fabricated by the process of fabricating the memory cells.

Preferably, the voltage supply circuit in the static semiconductor memory device is constructed by using a MOS transistor included in one of the plurality of memory cells.

By changing the interconnection of the MOS transistor as a component of one of the plurality of memory cells included in the static semiconductor memory device, the voltage supply circuit is fabricated. According to the invention, therefore, the voltage supply circuit for applying a voltage in a range from 0V to the threshold voltage across a memory cell in a test mode can be provided in the static semiconductor memory device without increasing the area.

Preferably, the voltage supply circuit in the static semiconductor memory device includes: first and second MOS transistors of a first conduction type provided in series between an external power source node and the second node; a third MOS transistor of a second conduction type provided between the second node and a ground node; and a resistive element connected in parallel with the third MOS transistor between the second node and the ground node. The first MOS transistor is turned on in response to the activated test mode signal and is turned off in response to the inactivated test mode signal, the second MOS transistor is connected as a diode between the first MOS transistor and the first node, and the third MOS transistor is turned off in response to the activated test mode signal and is turned on in response to the inactivated test mode signal.

In response to the activated test mode signal, the second MOS transistor supplies a voltage obtained by subtracting the threshold voltage from the external source voltage to the second node. In response to the inactivated test mode signal, the third MOS transistor supplies the ground voltage to the second node. According to the invention, therefore, the voltage supply circuit can be fabricated by using the MOS transistor as a component of a memory cell. As a result, the voltage obtained by subtracting the threshold voltage from the external source voltage can be stably supplied to the second node of a memory cell in a test mode.

Preferably, the resistive element in the voltage supply circuit is either a resistor or a MOS transistor of a second conduction type of which resistance value in an ON state is larger than a resistance value in an ON state of the MOS transistor as a component of the memory cell.

In the process of fabricating memory cells, the MOS transistor of the second conduction type or the resistor is fabricated as a resistive element, thereby forming the voltage supply circuit. According to the invention, therefore, when the MOS transistor of the second conduction type is used as a resistive element, the voltage supply circuit can be constructed only by MOS transistors. When the resistor is used as a resistive element, it is sufficient to form the MOS transistor on the layer of the MOS transistors, so that the area occupied by the voltage supply circuit can be reduced.

Preferably, the voltage setting circuit in the static semiconductor memory device includes: a source voltage supplying terminal supplying the external source voltage to the first node; and a voltage supply circuit supplying the external source voltage to the second node in response to the activated test mode signal and supplying a ground voltage to the second node in response to the inactivated test mode signal.

The voltage setting circuit supplies the external source voltage to the first node in a memory cell by the source voltage supply terminal and supplies the ground voltage or the external source voltage to the second node by the voltage supply circuit, thereby setting the voltage across the memory cell as the external source voltage in a normal operation and setting the voltage across the memory cell as 0V in a test mode. By switching the voltage to be supplied to the cell GND line in the memory cell, therefore, a test capable of detecting a memory cell having an abnormal current in a standby state can be conducted. A memory cell having an abnormal current in a standby mode can be detected in a short time.

Preferably, the voltage supply circuit in the static semiconductor memory device includes: a first MOS transistor of a first conduction type provided between an external source node and the second node; and a second MOS transistor of a second conduction type connected between the second node and a ground node. The first MOS transistor is turned on in response to the activated test mode signal and is turned off in response to the inactivated test mode signal, and the second MOS transistor is turned off in response to the activated test mode signal and is turned on in response to the inactivated test mode signal.

In response to the activated test mode signal, the first MOS transistor supplies the external source voltage to the second node in a memory cell. In response to the inactivated test mode signal, the second MOS transistor supplies the ground voltage to the second node. According to the invention, therefore, the voltage supply circuit can be fabricated by using a MOS transistor as a component of a memory cell. As a result, the external source voltage can be stably supplied to the second node in a memory cell in a test mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
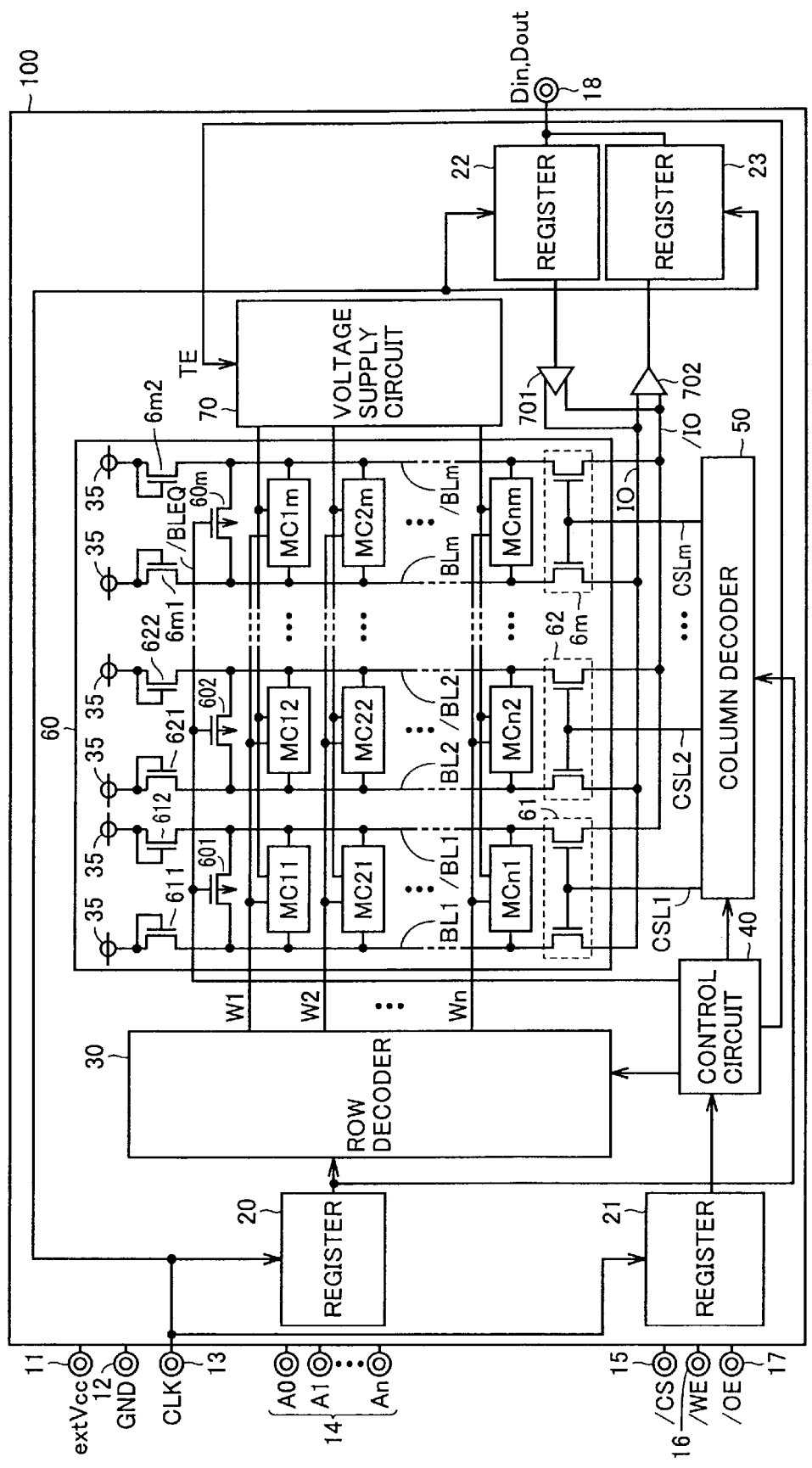
FIG. 1 is a schematic block diagram of a static semiconductor memory device according to a first embodiment of the invention.

Preferred embodiments of the invention will be described in detail with reference to the drawings. The same or corresponding components in the drawings will be designated by the same reference numerals and their description will not be repeated.

First Embodiment

Referring to FIG. 1, a static semiconductor memory device 100 according to a first embodiment has a power source terminal 11, a ground terminal 12, a clock input terminal 13, an address signal input terminal 14, control signal input terminals 15 to 17, an input/output terminal 18, registers 20 to 23, a row decoder 30, a control circuit 40, a column decoder 50, a memory cell array 60, a voltage supply circuit 70, a write driver 701, and a sense amplifier 702.

The power source terminal 11 is a terminal for receiving an external source voltage extVcc. The ground terminal 12 is a terminal for receiving a ground voltage GND. The clock input terminal 13 is a terminal for receiving a clock CLK. The address signal input terminal 14 is a terminal for receiving address signals A0 to An. The control signal input terminal 15 is a terminal for receiving a chip select signal /CS. The control signal input terminal 16 is a terminal for receiving a write enable signal /WE. The control signal input terminal 17 is a terminal for receiving an output enable signal /OE. The input/output terminal 18 is a terminal for inputting/outputting data.

The register 20 latches the address signals A0 to An supplied via the address signal input terminal 14 synchronously with the clock CLK supplied from the clock input terminal 13 and selectively supplies the address signals A0 to An to the row decoder 30 and the column decoder 50. The register 21 latches the chip select signal /CS received via the control signal input terminal 15, the write enable signal /WE received via the control signal input terminal 16, and the output enable signal /OE received via the control signal input terminal 17 synchronously with the clock CLK received via the clock input terminal 13, and supplies them to the control circuit 40. The register 22 latches write data Din received via the input/output terminal 18 synchronously with the clock CLK received via the clock input terminal 13 and supplies the latched write data Din to the write driver 701. The register 23 latches read data Dout from the sense amplifier 702 synchronously with the clock CLK received via the clock input terminal 13 and outputs the latched read data Dout to the input/output terminal 18.

The row decoder 30 decodes the address signals A0 to An received from the register 20 to generate a row address, and selectively activates word lines W1 to Wn in response to the generated row address. The control circuit 40 selects a predetermined operation mode in accordance with the chip select signal /CS, write enable signal /WE, and output enable signal /OE from the register 21 and controls the static semiconductor memory device 100. The column decoder 50 decodes the address signals A0 to An supplied from the register 20 to generate a column address, and selectively activates column selection lines CSL1 to CSLm in response to the generated column address.

Figure 23:
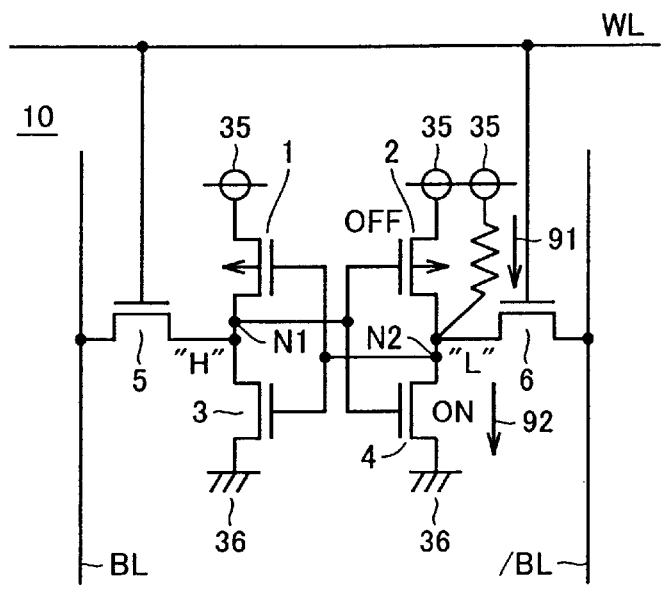
FIG. 23 is a circuit diagram of a static memory cell.
Figure 24:
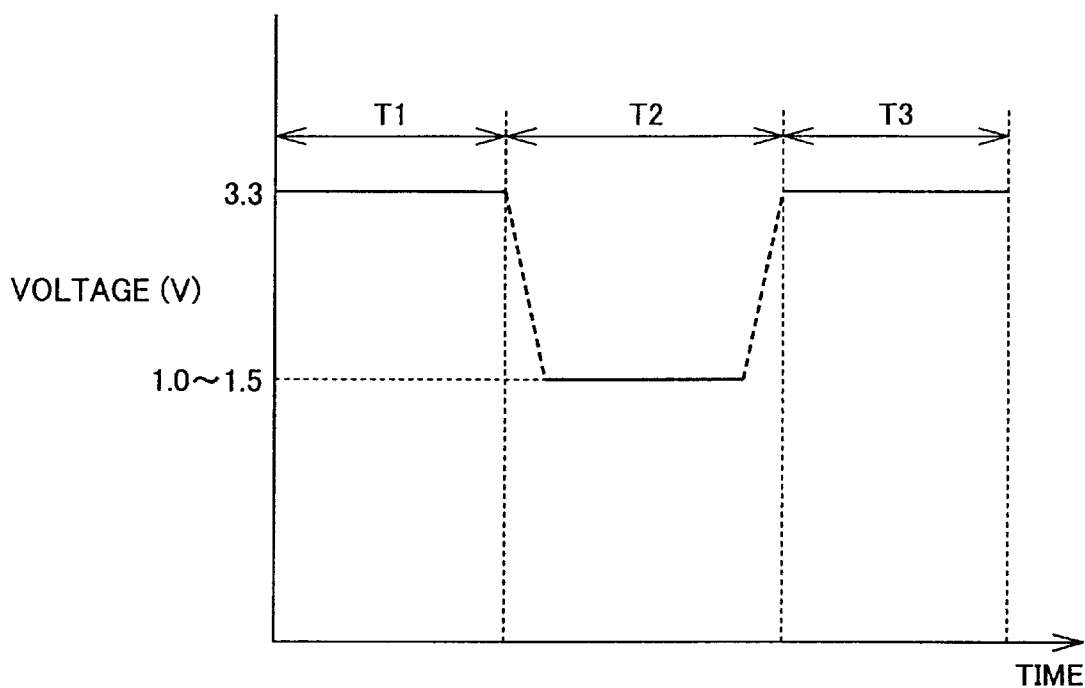
FIG. 24 is a timing chart of voltages applied to memory cells at the time of an operation test on the static memory cell.

The memory cell array 60 includes a plurality of memory cells MC11 to MC1m, MC21 to MC2m, . . . , and MCn1 to MCnm arranged in a matrix, n-channel MOS transistors 611 to 6m2, p-channel MOS transistors 601 to 60m, column selection gates 61 to 6m, word lines W1 to Wn, and bit line pairs BL1 and /BL1 to BLm and /BLm. Each of the plurality of memory cells MC11 to MC1m, MC21 to MC2m, . . . , and MCn1 to MCnm has the same configuration as that of the memory cell 10 shown in FIG. 23 and stores data. The n-channel MOS transistors 611 to 6m2 are connected as diodes between the power source nodes 35 and the bit lines BL1 to /BLm, respectively, and function as loads on the bit lines. Each of the p-channel MOS transistors 601 to 60m receives an equalize signal /BLEQ from the control circuit 40 by its gate terminal and, when the equalize signal /BLEQ is at the L (logical low) level, equalizes corresponding one of the bit line pairs BL1 and /BL1 to BLm and /BLm. Each of the column selection gates 61 to 6m is constructed by two n-channel MOS transistors. The column selection gates 61 to 6m connect the bit line pairs BL1 and /BL1 to BLm and /BLm to the input/output line pairs I/O and /IO by the column selection signals CSL1 to CSLm, respectively.

The voltage supply circuit 70 supplies, by a method which will be described hereinlater, the external source voltage extVcc to the cell Vcc lines of the plurality of memory cells MC11 to MC1m, MC21 to MC2m, . . . , and MCn1 to MCnm in a normal operation of the static semiconductor memory device 100 and supplies a threshold voltage Vth to the cell Vcc lines of the plurality of memory cells MC11 to MC1m, MC21 to MC2m, . . . , and MCn1 to MCnm in a test mode.

The write driver 701 writes the write data Din from the register 22 to the input/output line pairs IO and /IO. The sense amplifier 702 amplifies read data Dout from any of the memory cells MC11 to MC1m, MC21 to MC2m, . . . , and MCn1 to MCnm via the bit line pairs BL1 and /BL1 to BLm and/BLm and the input/output line pair IO and /IO, and outputs the amplified data to the register 23.

Figure 2:
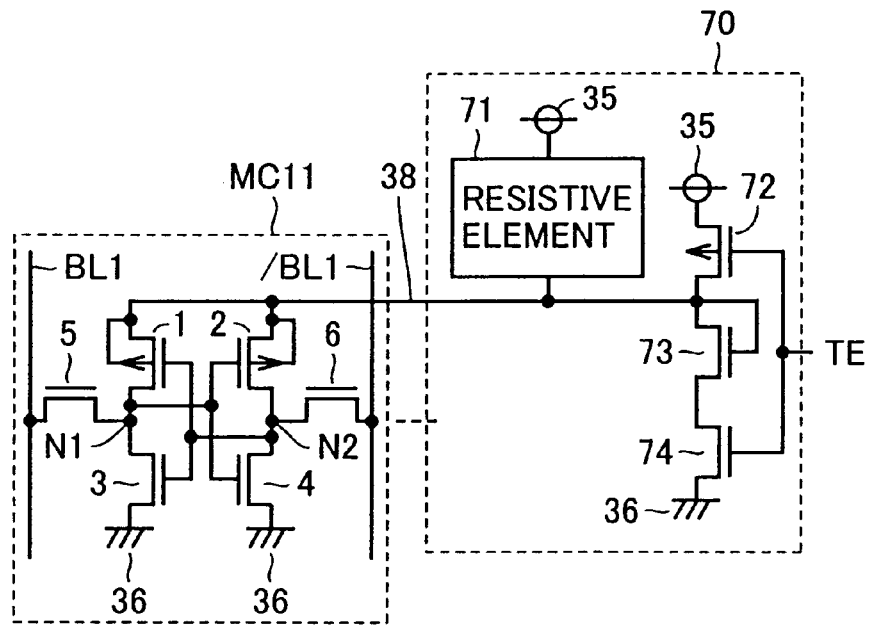
FIG. 2 is a circuit diagram of a voltage supply circuit and a memory cell in the static semiconductor memory device shown in FIG. 1.

Referring to FIG. 2, the voltage supply circuit 70 has a resistive element 71, a p-channel MOS transistor 72, and n-channel MOS transistors 73 and 74. The resistive element 71 is connected between the power source node 35 and a node 38. The p-channel MOS transistor 72 is connected between the power source node 35 and the node 38. In this case, the source terminal of the p-channel MOS transistor 72 is connected to the power source node 35, and the drain terminal is connected to the node 38. The n-channel MOS transistors 73 and 74 are connected in series between the node 38 and the ground node 36. The n-channel MOS transistor 73 is connected as a diode between the node 38 and the n-channel MOS transistor 74. In this case, the source and gate terminals of the n-channel MOS transistor 73 are connected to the node 38, the source terminal of the n-channel MOS transistor 74 is connected to the ground node 36, and the drain terminal of the n-channel MOS transistor 74 is connected to the drain terminal of the n-channel MOS transistor 73. The p-channel MOS transistor 72 and the n-channel MOS transistor 74 receive a test mode signal TE by their gate terminals.

When the test mode signal TE is at the H (logical high) level, the p-channel MOS transistor 72 is turned off, and the n-channel MOS transistor 74 is turned on. Consequently, the resistive element 71 supplies the power source, and the n-channel MOS transistor 73 supplies the threshold voltage Vth to the node 38. When the test mode signal TE is at the L level, the p-channel MOS transistor 72 is turned on, and the n-channel MOS transistor 74 is turned off. Consequently, the p-channel MOS transistor 72 supplies the external source voltage extVcc to the node 38.

When the test mode signal TE is at the H level, that is, when the test mode signal is activated, the voltage supply circuit 70 therefore supplies the threshold voltage Vth of the n-channel MOS transistor 73 to the node 38. When the test mode signal is at the L level, that is, when the test mode signal TE is inactivated, the voltage supply circuit 70 supplies the external source voltage extVcc to the node 38.

The node 38 is connected to the cell Vcc line of the plurality of memory cells MC11, . . . In FIG. 2, for simplicity, only the connecting relation between one memory cell MC11 and the voltage supply circuit 70 is shown. The connecting relation between each of the other memory cells MC12 to MC1m, MC21 to MC2m, . . . , and MCn1 to MCnm and the voltage supply circuit 70 is the same as that shown in FIG. 2. When the test mode signal TE of the L level is received, the voltage supply circuit 70 supplies the external source voltage extVcc to the cell Vcc line of the memory cell MC11. Consequently, writing, retaining, and reading operation of data on the memory cell MC are performed under the normal operation conditions. When the test mode signal TE of the H level is received, the voltage supply circuit 70 supplies the threshold voltage Vth of the n-channel MOS transistor 73 to the cell Vcc line of the memory cell MC11. Consequently, the threshold voltage Vth is applied to the cell Vcc line of the memory cell MC11 and a retention test is conducted. An OFF-state current of the p-channel MOS transistors 1 and 2 and the n-channel MOS transistors 3 to 6 constructing the memory cell MC11 is about $10^{-15}$A. An ON-state current of the memory cell MC11 is at least $10^{-8}$A or larger when the threshold voltage Vth of the n-channel MOS transistor 73 is applied. Consequently, the ON-state current/OFF-state current ratio in the storage node N2 is $10^{-8}/10^{-15}=10^7$. Even when the voltage to be supplied to the cell Vcc line of the memory cell MC11 is reduced to the threshold voltage Vth, a normal memory cell can sufficiently retain storage data. When the leak current is $10^{-8}$A or larger, the ON-state current/OFF-state current ratio in the storage node N2 cannot be obtained, so that the memory cell cannot retain the storage data. By applying the threshold voltage Vth of the n-channel MOS transistor 73 to the cell Vcc line of the memory cell MC11 to carry out the data retention test, a memory cell having an abnormal current in the standby mode can be extracted.

Figure 3:
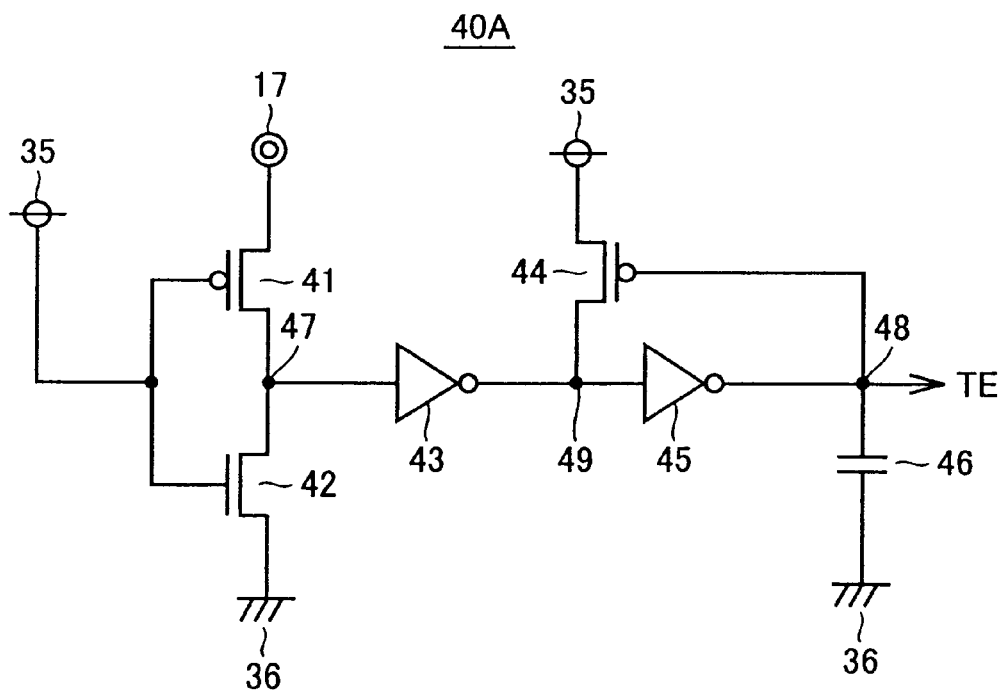
FIG. 3 is a circuit diagram of a test mode signal generating circuit included in a control circuit of the static semiconductor memory device shown in FIG. 1.

The control circuit 40 includes a test mode signal generating circuit 40A shown in FIG. 3. The test mode signal generating circuit 40A has p-channel MOS transistors 41 and 44, an n-channel MOS transistor 42, inverters 43 and 45, and a capacitor 46. The p-channel MOS transistor 41 and the n-channel MOS transistor 42 are connected in series between the control signal input terminal 17 and the ground node 36, and the external source voltage extVcc is applied to their gate terminals. The n-channel MOS transistor 42 is used as a high resistive element for passing a small amount of current from a node 47 to the ground node 36. The inverters 43 and 45 are connected in series between the node 47 and an output node 48. The p-channel MOS transistor 44 is connected between the power source node 35 and a node 49 and its gate terminal is connected to the output node 48. The capacitor 46 is connected between the output node 48 and the ground node 36.

In normal operation, the external source voltage extVcc or ground voltage GND is applied as the output enable signal /OE to the control signal input terminal 17. In this case, since the external source voltage extVcc has been applied to the gate terminal, the p-channel MOS transistor 41 becomes non-conductive, and the node 47 goes L level. As a result, the output node 48 is held at the L level.

At the time of conducting the retention test, a super Vcc voltage sufficiently higher than the external source voltage extVcc is applied to the control signal input terminal 17. The p-channel MOS transistor 41 is consequently made conductive, the node 47 goes H level, and the output node 48 is held at the H level.

As described above, when the external source voltage extVcc or ground voltage GND is applied to the control signal input terminal 17, the test mode signal generating circuit 40A generates the test mode signal TE of the L level. When the super Vcc voltage higher than the external source voltage extVcc is applied to the control signal input terminal 17, the test mode signal generating circuit 40A generates the test mode signal TE of the H level. The test mode signal TE generated by the test mode signal generating circuit 40A is outputted to the voltage supply circuit 70.

Referring again to FIG. 1, the data writing operation and the data reading operation in the static semiconductor memory device 100 will be described. First, the writing operation will be described. When the external source voltage extVcc is supplied to the static semiconductor memory device 100 via the power source terminal 11, the ground voltage GND is supplied to the static semiconductor memory device 100 via the ground terminal 12, the clock CLK is received via the clock input terminal 13, and the chip select signal /CS of the L level is received via the control signal input terminal 15, the register 21 latches the chip select signal /CS synchronously with the clock CLK and outputs the chip select signal/CS to the control circuit 40. When the control circuit 40 receives the chip select signal /CS of the L level, the static semiconductor memory device 100 enters a selection state. After that, when the write enable signal /WE of the L level is entered via the control signal input terminal 16, the register 21 latches the write enable signal /WE of the L level synchronously with the clock CLK and outputs it to the control circuit 40. The control circuit 40 makes the row decoder 30 and the column decoder 50 active on the basis of the write enable signal /WE of the L level to make the static semiconductor memory device 100 enter a data writable state. In this case, the output enable signal /OE made by the external source voltage extVcc, that is, the output enable signal /OE of the H level is entered via the control signal input terminal 17 to the control circuit 40, and the test signal generating circuit 40A included in the control circuit 40 outputs the test signal TE of the L level to the voltage supply circuit 70. The voltage supply circuit 70 supplies the external source voltage extVcc to the cell Vcc lines of the plurality of memory cells MC11 to MC1m, MC21 to MC2m, . . . , and MCn1 to MCnm.

After that, when the address signals A0 to An are received from the address signal input terminal 14, the register 20 latches the address signals A0 to An synchronously with the clock CLK, and selectively outputs the latched address signals A0 to An to the row decoder 30 and the column decoder 50. The row decoder 30 decodes the address signals A0 to An from the register 20, generates a row address and, on the basis of the generated row address, makes the word lines W1 to Wn selectively active. The column decoder 50 decodes the address signals A0 to An from the register 20, generates a column address and, on the basis of the generated column address, makes the column selection lines CSL1 to CSLm selectively active. It is assumed here that the word line W1 and the column selection line CSL1 are activated. Two n-channel MOS transistors constructing a column selection gate 61 are turned on, and the pair of bit lines BL1 and /BL1 are connected to the pair of input/output lines IO and /IO.

When the write data Din is entered via the input/output terminal 18, the register 22 latches the write data Din synchronously with the clock CLK and outputs it to the write driver 701. On the basis of the write data Din, the write driver 701 makes one of the pair of input/output lines IO and /IO go H level and makes the other go L level. Specifically, when the write data Din is "1", the write driver 701 sets the input/output line IO to the H level and sets the input/output line /IO to the L level. When the write data Din is "0", the write driver 701 sets the input/output line IO to the L level and sets the input/output line /IO to the H level.

The H level or L level on the pair of input/output lines IO and /IO is transmitted to the pair of bit lines BL1 and /BL1 via the column selection gate 61, and the write data Din is written in the memory cell MC11.

The reading operation will now be described. In a manner similar to the writing operation, the chip select signal /CS of the L level is entered via the control signal input terminal 15, and the static semiconductor memory device 100 enters a selection state. After that, when the output enable signal /OE (of the L level) made by the ground voltage GND is supplied to the control circuit 40 via the control signal input terminal 17, the control circuit 40 activates the row decoder 30 and the column decoder 50 on the basis of the output enable signal /OE of the L level and outputs the equalize signal /BLEQ of the L level. The p-channel MOS transistors 601 to 60m are turned on to equalize the potentials on the pair of bit lines BL1 and /BL1 to the pair of bit lines BLm and /BLm. Since the output enable signal /OE made by the ground voltage GND has been supplied, the test mode signal generating circuit 40A included in the control circuit 40 outputs the test mode signal TE of the L level to the voltage supply circuit 70 as described above. The voltage supply circuit 70 supplies the external source voltage extVcc to the cell Vcc lines of the plurality of memory cells MC11 to MC1m, MC21 to MC2m, . . . , and MCn1 to MCnm.

When the equalize signal /BLEQ goes H level, the p-channel MOS transistors 601 to 60m are turned off, and the address signals A0 to An are supplied from the address signal input terminal 14, in a manner similar to the writing operation, the word lines W1 to Wn and the column selection lines CSL1 to CSLm are selectively activated. For example, when it is assumed that the word line W1 and the column selection line CSL1 are activated, on the basis of data stored in the memory cell MC11, one of the pair of bit lines BL1 and /BL1 goes H level and the other goes L level. When the data stored in the memory cell MC11 is "1", the bit line BL1 goes H level and the bit line /BL1 goes L level. When the data stored in the memory cell MC11 is "0", the bit line BL1 goes L level and the bit line /BL1 goes H level. The H or L level on the pair of bit lines BL1 and /BL1 is transmitted to the pair of input/output lines IO and /IO via the column selection gate 61. The sense amplifier 702 receives a signal of the H or L level.

The sense amplifier 702 compares the potential on the input/output line IO with the potential on the input/output line /IO, and outputs read data Dout according to the result of comparison to the register 23. Specifically, when the input/output line IO is at the H level and the input/output line /IO is at the L level, the sense amplifier 702 outputs "1" as the read data Dout to the register 23. When the input/output line IO is at the L level and the input/output line /IO is at the H level, the sense amplifier 702 outputs "0" as the read data Dout to the register 23. The register 23 outputs the read data Dout to the outside via the input/output terminal 18. This is the end of the data reading operation.

Figure 4:
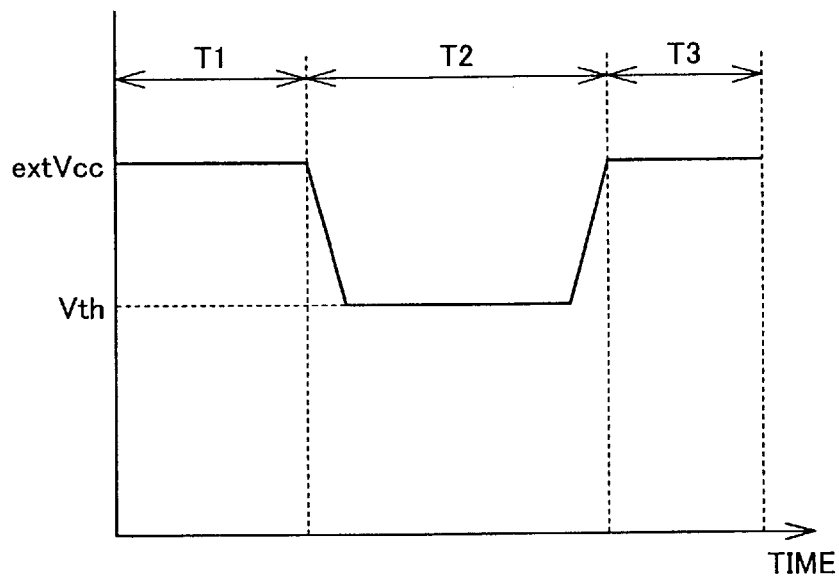
FIG. 4 is a timing chart of voltages applied to memory cells at the time of an operation test in the first embodiment.

Referring to FIG. 4, an operation test in the first embodiment will be described. In a period T1, the external source voltage extVcc is supplied from the voltage supply circuit 70 to the cell Vcc lines of the plurality of memory cells MC11 to MC1m, MC21 to MC2m, . . . , and MCn1 to MCnm, and the operation of writing or reading data is performed. In a period T2, the super Vcc voltage is applied to the control signal input terminal 17, and the test mode signal generating circuit 40A included in the control circuit 40 outputs the test mode signal TE of the H level to the voltage supply circuit 70. The voltage supply circuit 70 supplies the threshold voltage Vth of the n-channel MOS transistor 73 to the cell Vcc line of the memory cell, thereby applying the threshold voltage Vth across the memory cell. This state is kept for a predetermined time.

After that, in a period T3, the voltage supply circuit 70 supplies the external source voltage extVcc to the cell Vcc line of the memory cell, and the data is read. The read data Dout is compared with the write data Din, and a memory cell having an abnormal current in the standby mode is extracted in the retention test.

Figure 5:
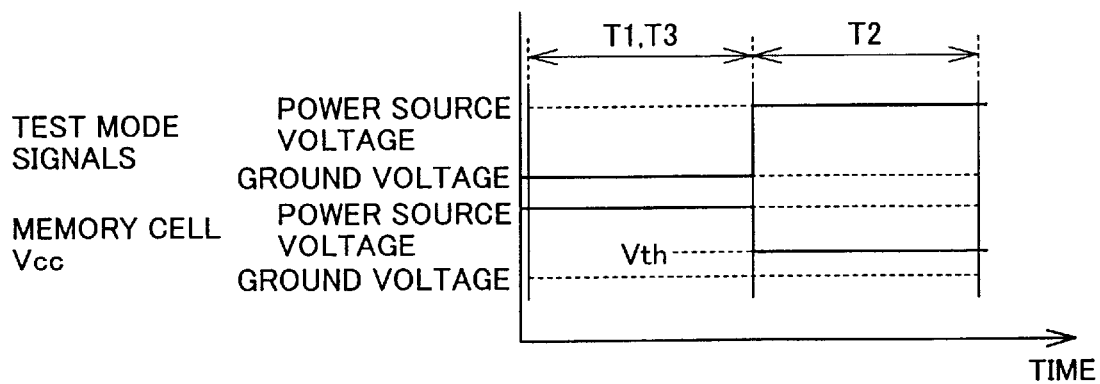
FIG. 5 is a timing chart of voltages as test mode signals in a normal operation mode and a test mode and voltages supplied to a cell Vcc line of a memory cell in the static semiconductor memory device shown in FIG. 1.

In the operation test of the first embodiment, therefore, the voltage value as the test mode signal TE and the value of the voltage supplied to the cell Vcc line of the memory cell change as shown in FIG. 5. Specifically, in the periods T1 and T3 shown in FIG. 4, the voltage supply circuit 70 receives the test mode signal TE made by the ground voltage GND and supplies the external source voltage extVcc to the cell Vcc line of the memory cell. On the other hand, in the period T2 shown in FIG. 4, the voltage supply circuit 70 receives the test mode signal TE made by the external source voltage extVcc and supplies the threshold voltage Vth of the n-channel MOS transistor 73 to the cell Vcc line of the memory cell.

The retention test in the first embodiment is characterized in that the threshold voltage Vth of the n-channel MOS transistor is supplied to the cell Vcc line of the memory cell. By largely decreasing the voltage supplied to the cell Vcc line of the memory cell from the external source voltage extVcc at the time of normal use to the threshold voltage Vth, the retention test can be carried out in a few seconds. That is, the period T2 shown in FIG. 4 can be shortened to a few seconds. As a result, the operation test on the static semiconductor memory device 100 can be conducted efficiently. Since the n-channel MOS transistor 73 for supplying the threshold voltage Vth to the cell Vcc line of the memory cell is fabricated in the same process as the p-channel MOS transistors 1 and 2 and the n-channel MOS transistors 3 to 6 constructing the memory cell, the characteristics of the n-channel MOS transistor 73 are the same as those of the n-channel MOS transistor as a component of the memory cell. Even when variations in process or change in temperature occurs, the threshold voltage Vth can be accurately supplied to the cell Vcc line of the memory cell at the time of the retention test.

Publication of Japanese Patent Laying-Open No. 11-185498(1999) discloses a method of carrying out a retention test by supplying a voltage of (external source voltage -3Vth) to the cell Vcc line of a memory cell. According to the method disclosed in Japanese Patent Laying-Open No. 11-185498(1999), the ON-state current of the n-channel MOS transistor 4 in the memory cell MC11 shown in FIG. 2 is much larger than $10^{-8}$A, so that detection of a memory cell having an abnormal current in the standby mode at a leak current level ($10^{-8}$A) as an object of the present invention cannot be realized. The idea of the present invention is, therefore, quite different from that of the technique disclosed in Japanese Patent Laying-Open No. 11-185498(1999).

Figure 6:
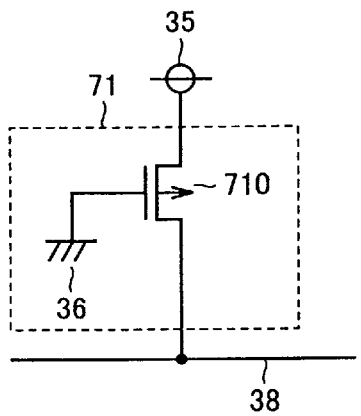
FIG. 6 is a circuit diagram showing an example of a resistive element in the voltage supply circuit illustrated in FIG. 2.

Referring to FIG. 6, the resistive element 71 shown in FIG. 2 has a p-channel MOS transistor 710 provided between the power source node 35 and the node 38. The p-channel MOS transistor 710 receives the ground voltage GND from the ground node 36 by its gate terminal and has an ON-state resistance higher than those of the p-channel MOS transistors 1 and 2 and the n-channel MOS transistors 3 to 6 constructing the memory cell.

Figure 7:
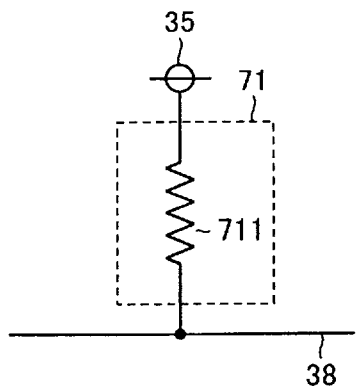
FIG. 7 is a circuit diagram showing another example of a resistive element in the voltage supply circuit illustrated in FIG. 2.

The resistive element 71 is not limited to the p-channel MOS transistor 710 shown in FIG. 6 but may be a resistor 711 provided between the power source node 35 and the node 38 illustrated in FIG. 7. The resistor 711 has resistance equal to the ON-state resistance of the p-channel MOS transistor 710 shown in FIG. 6. The resistor 711 is formed on the p-channel MOS transistor 72, and n-channel MOS transistors 73 and 74, so that the area occupied by the voltage supply circuit 70 can be reduced.

Figure 8:
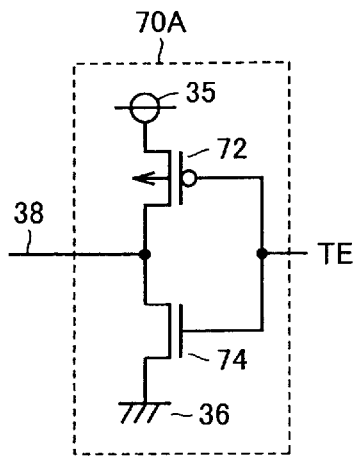
FIG. 8 is a circuit diagram of another voltage supply circuit in the static semiconductor memory device shown in FIG. 1.

The voltage supply circuit in the invention is not limited to the voltage supply circuit 70 illustrated in FIG. 2 but may be a voltage supply circuit 70A shown in FIG. 8. The voltage supply circuit 70A corresponds to a circuit obtained by eliminating the resistive element 71 and the n-channel MOS transistor 73 from the voltage supply circuit 70. In response to the test mode signal TE of the H level, the voltage supply circuit 70A supplies 0V to the node 38. In response to the test mode signal TE of the L level, the voltage supply circuit 70A supplies the external source voltage extVcc to the node 38. When the voltage supply circuit 70A is used for the static semiconductor memory device 100, therefore, the retention test can be conducted by setting the voltage to be applied across the memory cell as 0V. Consequently, time of the retention test can be reduced to the order of msec. Since the p-channel MOS transistor 72 and the n-channel MOS transistor 74 as components of the voltage supply circuit 70A are fabricated in the same process as the p-channel MOS transistors 1 and 2 and the n-channel MOS transistors 3 to 6 constructing a memory cell, even when variations in process or temperature change occur, 0V can be accurately supplied to the cell Vcc line of the memory cell.

Since the ground terminal 12 supplies the ground voltage GND to the plurality of memory cells MC11 to MC1m, MC21 to MC2m, . . . , and MCn1 to MCnm, when the external source voltage extVcc or threshold voltage Vth (or 0V) is supplied from the voltage supply circuit 70 or 70A to the cell Vcc line, the voltage across each of the memory cells MC11 to MC1m, MC21 to MC2m, . . . , and MCn1 to MCnm is set as the threshold voltage Vth or 0V. Therefore, the voltage supply circuit 70 or 70A and the ground terminal 12 construct a "voltage setting circuit".

According to the first embodiment, since the static semiconductor memory device has therein the voltage supply circuit for supplying the external source voltage to the cell Vcc line of a memory cell in the normal operation mode, and supplying 0V or the threshold voltage Vth of the n-channel MOS transistor to the memory cell Vcc line in the test mode, a memory cell having an abnormal in the standby mode can be extracted by a retention test. The MOS transistors as components of the voltage supply circuit are fabricated in the same process as the MOS transistors constructing a memory cell. Consequently, even when variations in process or temperature change occur, a voltage applied across a memory cell can be accurately set as 0V or the threshold voltage.

Second Embodiment

Figure 9:
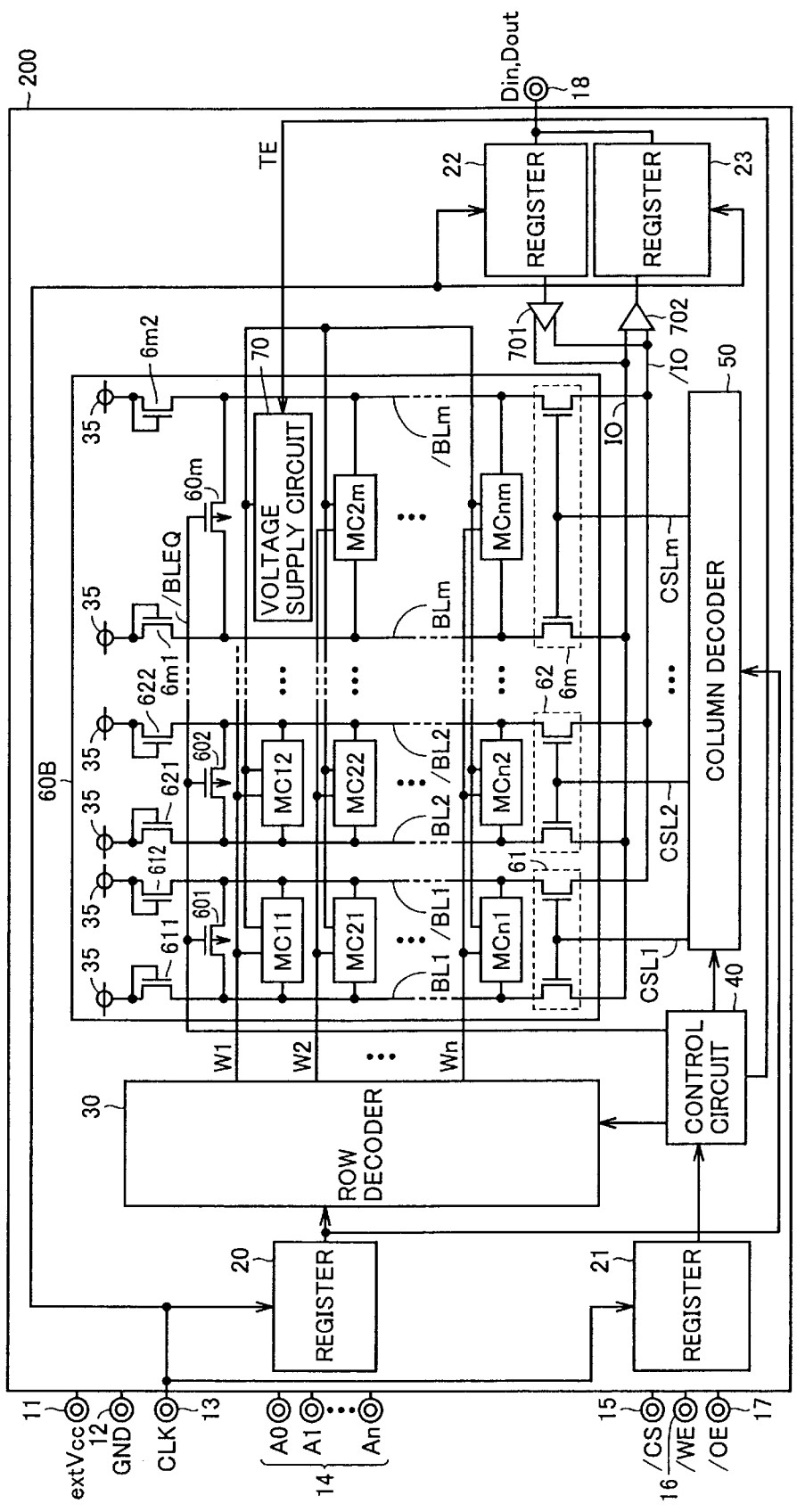
FIG. 9 is a schematic block diagram of a semiconductor memory device according to a second embodiment.

Referring to FIG. 9, a static semiconductor memory device according to a second embodiment will be described. A static semiconductor memory device 200 is similar to the static semiconductor memory device 100 in FIG. 1 except that the voltage supply circuit 70 is moved in the memory cell array 60 and the memory cell array 60 is replaced by a memory cell array 60B. The memory cell array 60B is obtained by replacing any one of the plurality of memory cells MC11 to MC1m, MC21 to MC2m, . . . , and MCn1 to MCnm arranged in a matrix with the voltage supply circuit 70.

Figure 10:
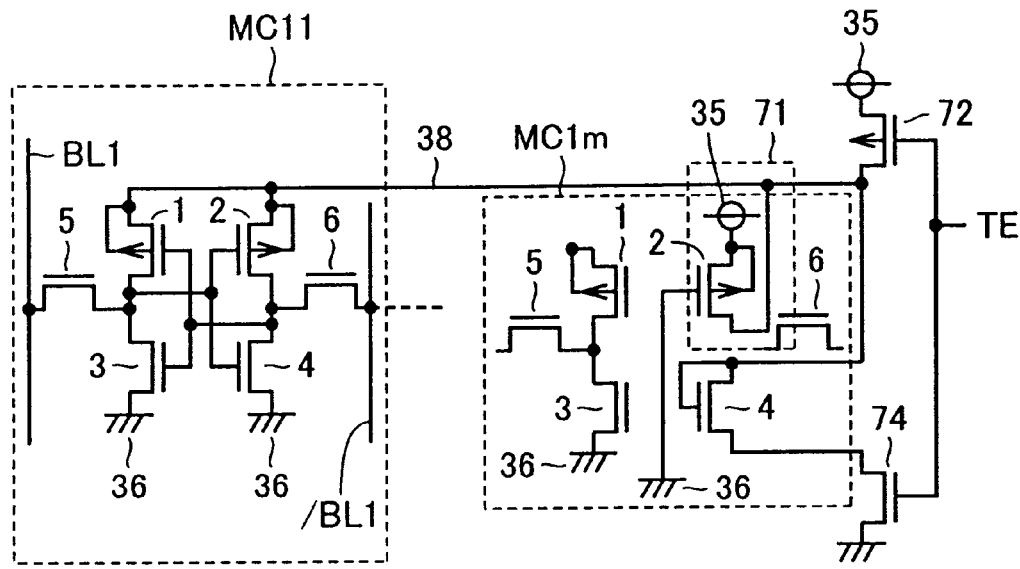
FIG. 10 is a circuit diagram of a voltage supply circuit and a memory cell in the static semiconductor memory device shown in FIG. 9.

Referring to FIG. 10, the voltage supply circuit 70 is fabricated by using the p-channel MOS transistor 2 and the n-channel MOS transistor 4 out of the p-channel MOS transistors 1 and 2 and the n-channel MOS transistors 3 to 6 constructing the memory cell MC1m. In this case, the placement of the p-channel MOS transistor 2 and the N-channel MOS transistor 4 is not changed. The p-channel MOS transistor 2 is provided between the power source node 35 and the node 38. The p-channel MOS transistor 2 is disposed so that its gate terminal receives the ground voltage GND from the ground node 36. The n-channel MOS transistor 4 is connected as a diode between the n-channel MOS transistor 74 and the node 38. In such a manner, the voltage supply circuit 70 is constructed by the p-channel MOS transistors 2 and 72 and the n-channel MOS transistors 4 and 74.

As described above, in the second embodiment, without changing the placement of the MOS transistors constructing one of the plurality of memory cells MC11 to MC1m, MC21 to MC2m, . . . , and MCn1 to MCnm, the voltage supply circuit 70 is fabricated. As a result, the p-channel MOS transistors and the n-channel MOS transistors constructing the voltage supply circuit 70 can have the same characteristics as those of the p-channel MOS transistors and the n-channel MOS transistors constructing the memory cells MC11 to MC1m, MC21 to MC2m, . . . , and MCn1 to MCnm. The voltage supply circuit 70 can supply the threshold voltage Vth to the cell Vcc lines of the memory cells MC11 to MC1m, MC21 to MC2m, . . . , and MCn1 to MCnm more accurately.

Figure 11:
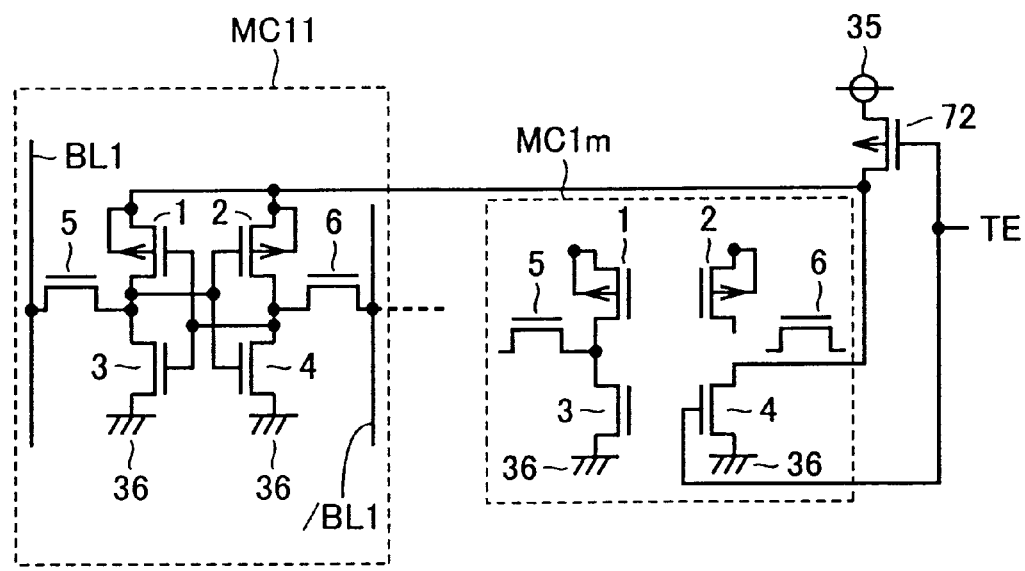
FIG. 11 is a circuit diagram of memory cells in the static semiconductor memory device in FIG. 9, showing another voltage supply circuit.

In the second embodiment, it is also possible to form the voltage supply circuit 70A by using one of the memory cells MC11 to MC1m, MC21 to MC2m, . . . , and MCn1 to MCnm. Specifically, referring to FIG. 11, the voltage supply circuit 70A is fabricated by using the n-channel MOS transistor 4 out of the MOS transistors constructing the memory cell MC1m. That is, the voltage supply circuit 70A is fabricated by connecting the drain terminal of the n-channel MOS transistor 4 which has been connected to the p-channel MOS transistor 2 to the node 38.

In the static semiconductor memory device 200 having the memory cell array 60B including the voltage supply circuits 70 and 70A as well, the writing and reading operations of data and the retention test can be performed by the same operations as those described in the first embodiment.

It has been described above that each of the voltage supply circuits 70 and 70A is fabricated by using one of the plurality of memory cells MC11 to MC1m, MC21 to MC2m, . . . , and MCn1 to MCnm. The voltage supply circuit 70 or 70A may be fabricated by using one of the plurality of memory cells arranged in the row direction every row. The other is similar to the first embodiment.

According to the second embodiment, in the static semiconductor memory device, since the voltage supply circuit for supplying the external source voltage to the memory cells in the normal operation mode, and supplying 0V or the threshold voltage Vth of the n-channel MOS transistor to the memory cells in the test mode is fabricated by using one of the plurality of memory cells, even when variations in process or temperature change occur, 0V or the threshold voltage can be more accurately applied across each of the plurality of memory cells. Moreover, since the voltage supply circuit is formed in the memory cell array, the size of the static semiconductor memory device can be reduced.

Third Embodiment

Figure 12:
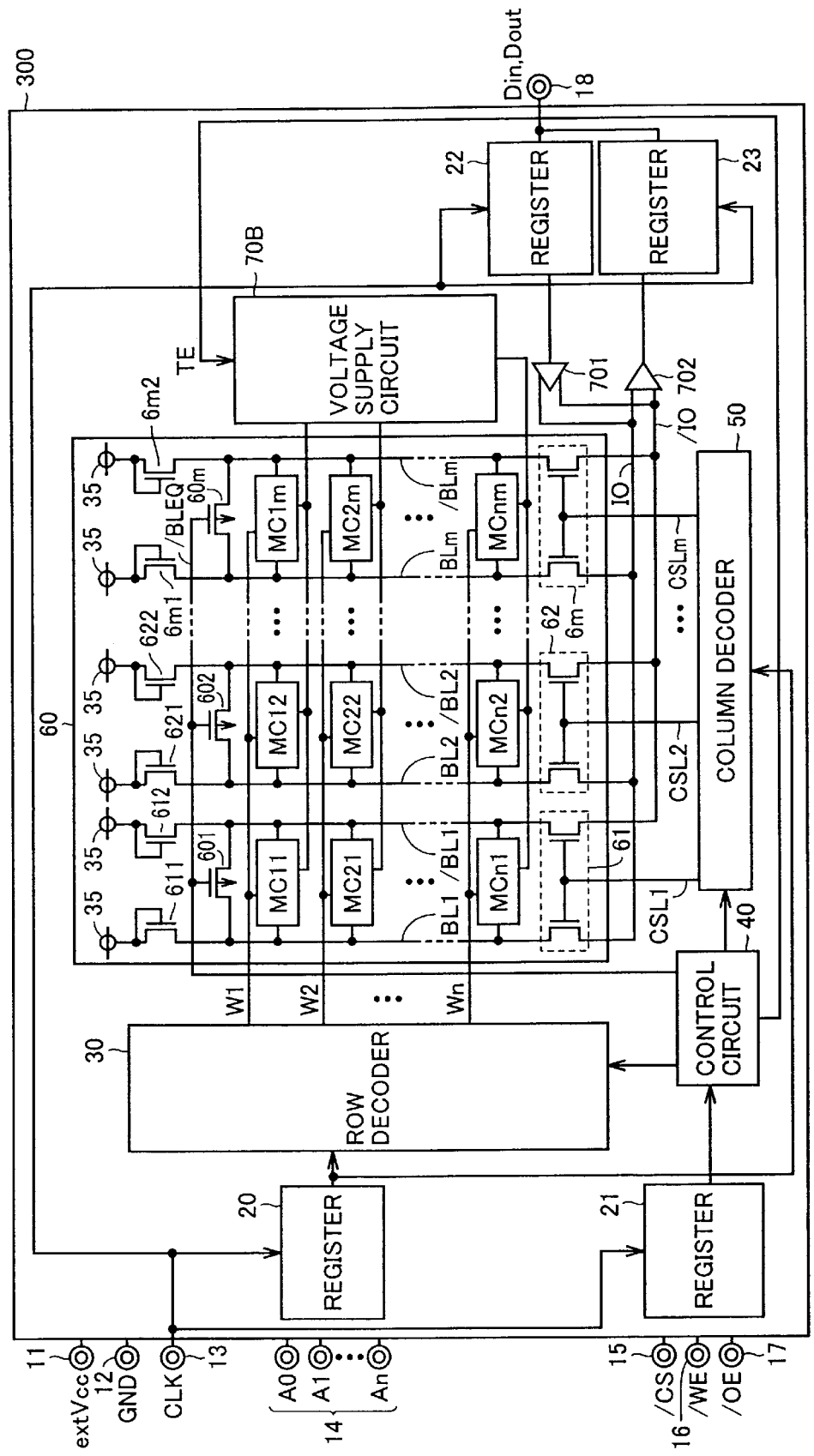
FIG. 12 is a schematic block diagram of a static semiconductor memory device according to a third embodiment.

Referring to FIG. 12, a static semiconductor memory device 300 according to a third embodiment is similar to the static semiconductor memory device 100 shown in FIG. 1 except that the voltage supply circuit 70 is replaced by a voltage supply circuit 70B and the test mode signal generating circuit 40A included in the control circuit 40 is replaced by a test mode signal generating circuit 40B. The other is similar to the static semiconductor memory device, 100.

On the basis of the test mode signal TE, as will be described hereinlater, the voltage supply circuit 70B applies the ground voltage GND or a voltage "extVcc−Vth" obtained by subtracting the threshold voltage from the external source voltage to cell GND lines of the plurality of memory cells MC11 to MC1m, MC21 to MC2m, . . . , and MCn1 to MCnm.

Figure 13:
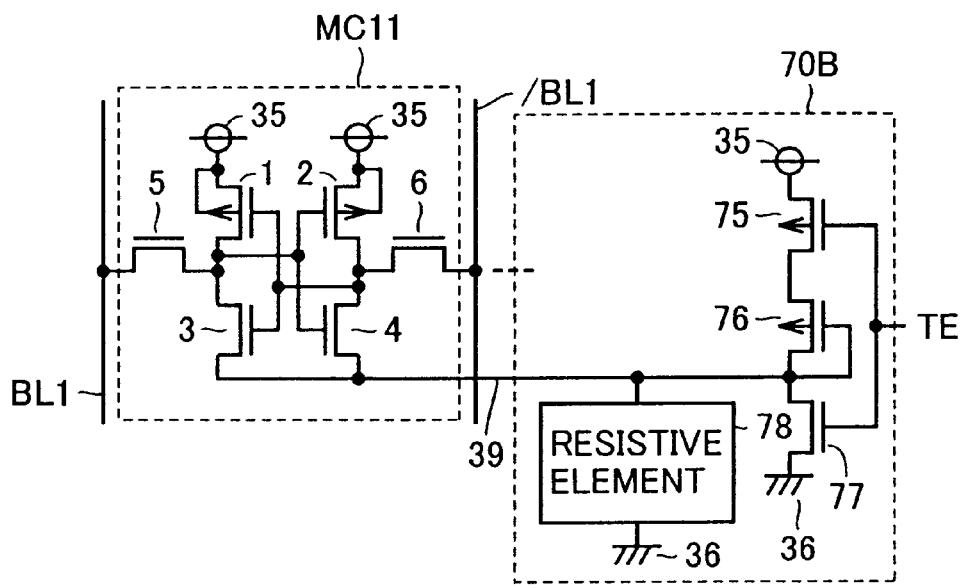
FIG. 13 is a circuit diagram of a voltage supply circuit and a memory cell in the static semiconductor memory device shown in FIG. 12.

Referring to FIG. 13, the voltage supply circuit 70B has p-channel MOS transistors 75 and 76, an n-channel MOS transistor 77, and a resistive element 78. The p-channel MOS transistors 75 and 76 are connected in series between the power source node 35 and the node 39. The p-channel MOS transistor 76 is connected as a diode between the p-channel MOS transistor 75 and the node 39. The n-channel MOS transistor 77 is provided between the node 39 and the ground node 36. The p-channel MOS transistor 75 and the n-channel MOS transistor 77 receive the test mode signal TE by their gate terminals.

When the voltage supply circuit 70B receives the test mode signal TE of the H level, the p-channel MOS transistor 75 is turned off and the n-channel MOS transistor 77 is turned on, thereby supplying the ground voltage GND to the node 39. When the voltage supply circuit 70B receives the test mode signal TE of the L level, the p-channel MOS transistor 75 is turned on, the n-channel MOS transistor 77 is turned off, and the resistive element 78 supplies the power to thereby supply the voltage "extVcc−Vth" obtained by subtracting the threshold voltage Vth of the p-channel MOS transistor 76 from the external source voltage extVcc to the node 39. The node 39 is connected to the cell GND line of the memory cell MC11. In such a manner, the voltage supply circuit 70B supplies the ground voltage GND or the voltage "extVcc–Vth" to the cell GND line of the memory cell MC11 in response to the logic level of the test mode signal TE.

Figure 14:
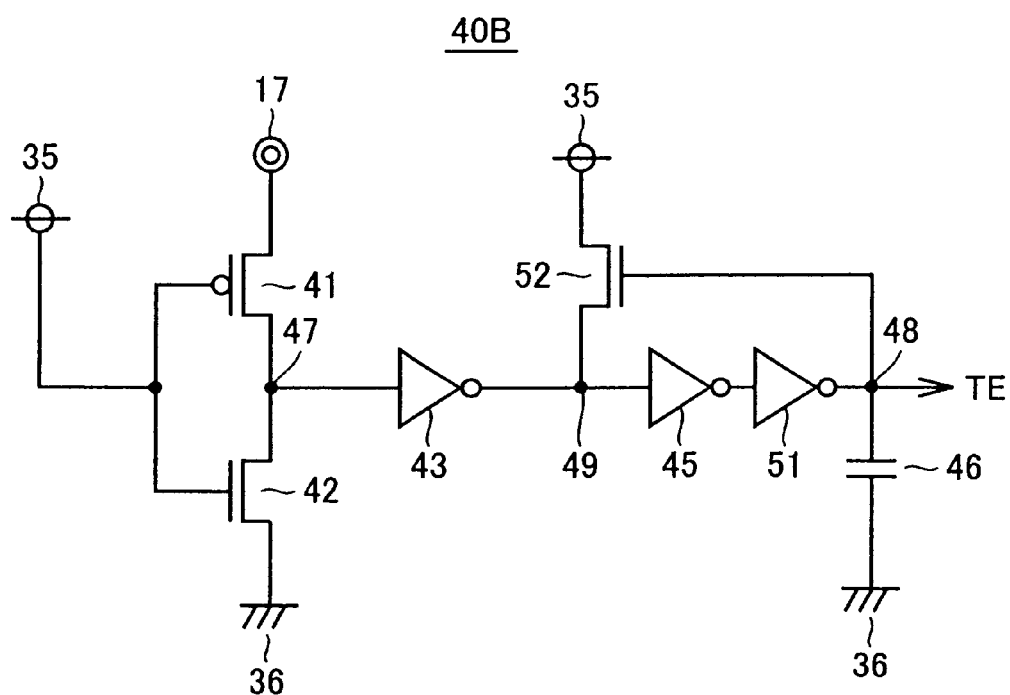
FIG. 14 is a circuit diagram of a test mode signal generating circuit included in a control circuit of the static semiconductor memory device shown in FIG. 12.

The control circuit 40 includes the test mode signal generating circuit 40B shown in FIG. 14. Referring to FIG. 14, the test mode signal generating circuit 40B is obtained by adding an inverter 51 between the inverter 45 and the output node 48 in the test mode signal generating circuit 40A shown in FIG. 3 and replacing the p-channel MOS transistor 44 with an n-channel MOS transistor 52.

When the ground voltage GND or the external source voltage extVcc is applied to the control signal input terminal 17, the p-channel MOS transistor 41 becomes nonconductive, so that the node 47 goes L level and the output node 48 is held H level. When the super Vcc higher than the external source voltage extVcc is applied to the control signal input terminal 17, the p-channel MOS transistor 41 is made conductive, so that the node 47 goes H level and the output node 48 is held L level. The test mode signal generating circuit 40B therefore outputs the test mode signal TE of the H or L level in response to the value of the voltage applied to the control signal input terminal 17 to the voltage supply circuit 70B.

Figure 15:
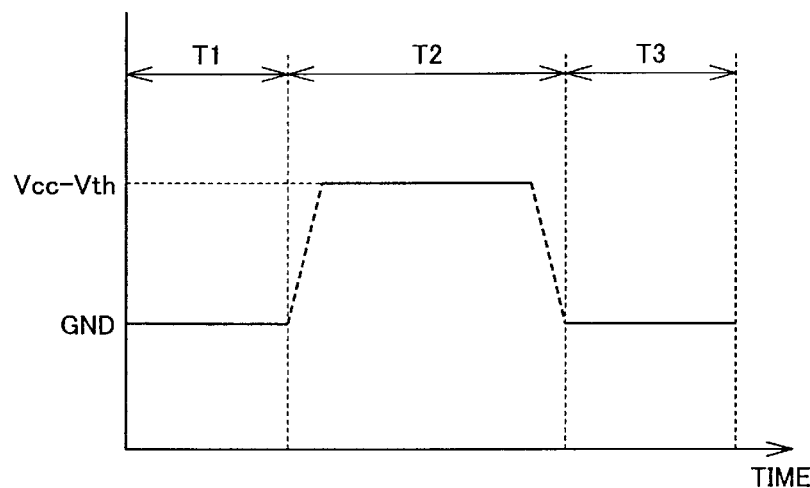
FIG. 15 is a timing chart of voltages supplied to memory cells at the time of an operation test in the third embodiment.

Referring to FIG. 15, an operation test in the third embodiment will be described. In a period T1, the ground voltage GND is supplied from the voltage supply circuit 70B to the cell GND lines of the plurality of memory cells MC11 to MC1m, MC21 to MC2m, . . . , and MCn1 to MCnm, thereby writing and reading data. In a period T2, the super Vcc voltage is applied to the control signal input terminal 17, and the test mode signal generating circuit 40B included in the control circuit 40 outputs the test mode signal TE of the L level to the voltage supply circuit 70B. The voltage supply circuit 70B supplies the voltage "extVcc–Vth" obtained by subtracting the threshold voltage Vth of the p-channel MOS transistor 76 from the external source voltage extVcc to the cell GND lines of the memory cells. Consequently, the threshold voltage Vth is applied across each of the memory cells. This state is kept for a predetermined time.

After that, in a period T3, the voltage supply circuit 70B supplies the ground voltage GND to the cell GND lines of the memory cells and the operation of reading data is performed. The read data is compared with the written data, and a memory cell having an abnormal current in the standby mode is extracted by the retention test.

Figure 16:
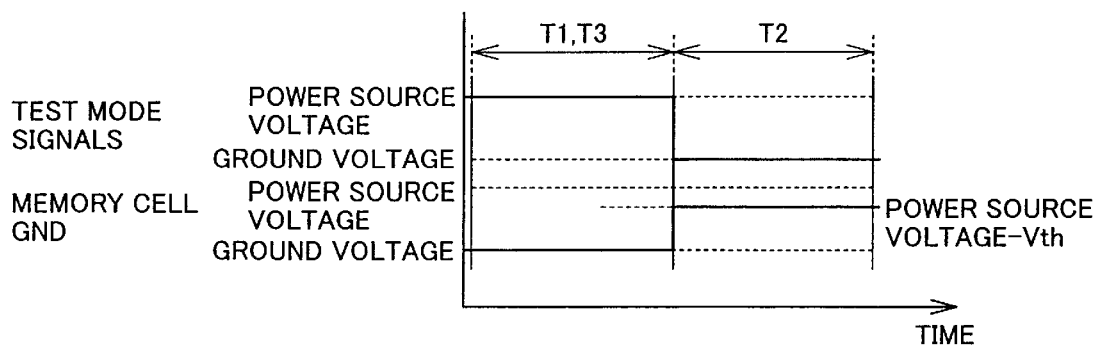
FIG. 16 is a timing chart of voltages as test mode signals in a normal operation mode and in a test mode of the static semiconductor memory device shown in FIG. 12 and voltages supplied to a cell GND line of a memory cell.

In the operation test of the third embodiment, therefore, the voltage value as the test mode signal TE and the voltage value supplied to the cell GND lines of the memory cells change as shown in FIG. 16. Specifically, in the periods T1 and T3 shown in FIG. 15, the voltage supply circuit 70B receives the test mode signal TE made by the external source voltage extVcc, and supplies the ground voltage GND to the cell GND lines of the memory cells. On the other hand, in the period T2 shown in FIG. 15, the voltage supply circuit 70B receives the test mode signal TE made by the ground voltage GND and supplies the voltage "extVcc–Vth" obtained by subtracting the threshold voltage Vth of the p-channel MOS transistor 76 from the external source voltage extVcc to the cell GND lines of the memory cells.

As described above, the retention test in the third embodiment is characterized by the supply of the voltage "extVcc–Vth" to the cell GND lines of the memory cells. By largely increasing the voltage to be supplied to the cell GND lines of the memory cells from the ground voltage GND in the normal use to the voltage "extVcc–Vth", the retention test can be conducted in a few seconds. That is, the period T2 shown in FIG. 15 can be shortened to a few seconds. As a result, the operation test on the static semiconductor memory device 300 can be efficiently carried out. Since the p-channel MOS transistor 76 for supplying the voltage "extVcc–Vth" to the cell GND lines of the memory cells is fabricated by the same process as that of the p-channel MOS transistors 1 and 2 and the n-channel MOS transistors 3 to 6 constructing a memory cell, the p-channel MOS transistor 76 can have the same characteristics as those of the p-channel MOS transistors constructing a memory cell. Even when variations in process or temperature change occur, the voltage "extVcc–Vth" can be accurately supplied to the cell GND lines of the memory cells at the time of the retention test.

Figure 17:
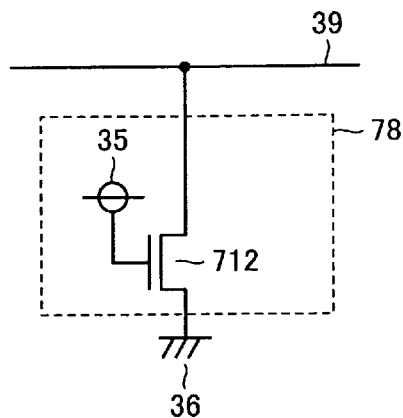
FIG. 17 is a circuit diagram showing an example of a resistive element in the voltage supply circuit in FIG. 13.

Referring to FIG. 17, the resistive element 78 shown in FIG. 13 has an n-channel MOS transistor 712 provided between the node 39 and the ground node 36. The n-channel MOS transistor 712 receives the external source voltage extVcc from the power source node 35 by its gate terminal, and has an ON-state resistance higher than that of the p-channel MOS if transistors 1 and 2 and the n-channel MOS transistors 3 to 6 constructing a memory cell.

Figure 18:
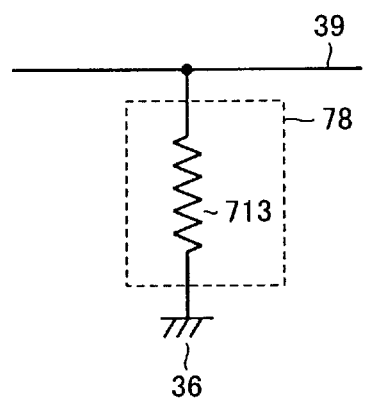
FIG. 18 is a circuit diagram showing another example of the resistive element in the voltage supply circuit in FIG. 13.

The resistive element 78 is not limited to the n-channel MOS transistor 712 shown in FIG. 17 but may be a resistor 713 shown in FIG. 18 provided between the node 39 and the ground node 36. The resistor 713 has the same ON-state resistance as that of the n-channel MOS transistor 712 shown in FIG. 17. The resistor 713 can be formed on the p-channel MOS transistors 75 and 76 and the n-channel MOS transistor 77, so that the area occupied by the voltage supply circuit 70B can be reduced.

Figure 19:
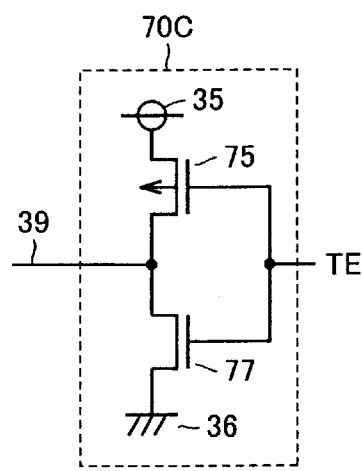
FIG. 19 is a circuit diagram of another voltage supply circuit in the static semiconductor memory device shown in FIG. 12.

The voltage supply circuit in the invention is not limited to the voltage supply circuit 70B illustrated in FIG. 13 but may be a voltage supply circuit 70C shown in FIG. 19. The voltage supply circuit 70C corresponds to a circuit obtained by eliminating the resistive element 78 and the p-channel MOS transistor 76 from the voltage supply circuit 70B. In response to the test mode signal TE of the H level, the voltage supply circuit 70C supplies 0V to the node 39. In response to the test mode signal TE of the L level, the voltage supply circuit 70C supplies the external source voltage extVcc to the node 39. When the voltage supply circuit 70C is used for the static semiconductor memory device 100, the retention test can be conducted by setting the voltage to be applied across a memory cell to 0V. Consequently, time of the retention test can be reduced to the order of msec. Since the p-channel MOS transistor 75 and the n-channel MOS transistor 77 as components of the voltage supply circuit 70C are fabricated in the same process as the p-channel MOS transistors 1 and 2 and the n-channel MOS transistors 3 to 6 constructing a memory cell, even when variations in process or temperature change occurs, the voltage "extVcc–Vth" can be accurately supplied to the cell GND lines of the memory cells.

Since the power source terminal 11 supplies the external source voltage extVcc to the plurality of memory cells MC11 to MC1m, MC21 to MC2m, . . . , and MCn1 to MCnm, when the ground voltage GND or the voltage "extVcc–Vth" (or external source voltage extVcc) is supplied from the voltage supply circuit 70B or 70C, the voltage across each of the memory cells MC11 to MC1m, MC21 to MC2m, . . . , and MCn1 to MCnm is set to the threshold voltage Vth or 0V. Therefore, the voltage supply circuit 70B or 70C and the power source terminal 11 construct a "voltage setting circuit".

According to the third embodiment, since the static semiconductor memory device has therein the voltage supply circuit for supplying the a ground voltage to the cell GND line of a memory cell in the normal operation mode, and supplying the external source voltage extVcc or the voltage "extVcc–Vth" to the memory cells in the test mode, a memory cell having an abnormal current in the standby mode can be extracted by a retention test. The MOS transistors constructing the voltage supply circuit are fabricated in the same process as the MOS transistors constructing a memory cell. Consequently, even when variations in process or temperature change occur, a voltage applied across a memory cell can be accurately set to 0V or the threshold voltage. The other is similar to the first embodiment.

Fourth Embodiment

Figure 20:
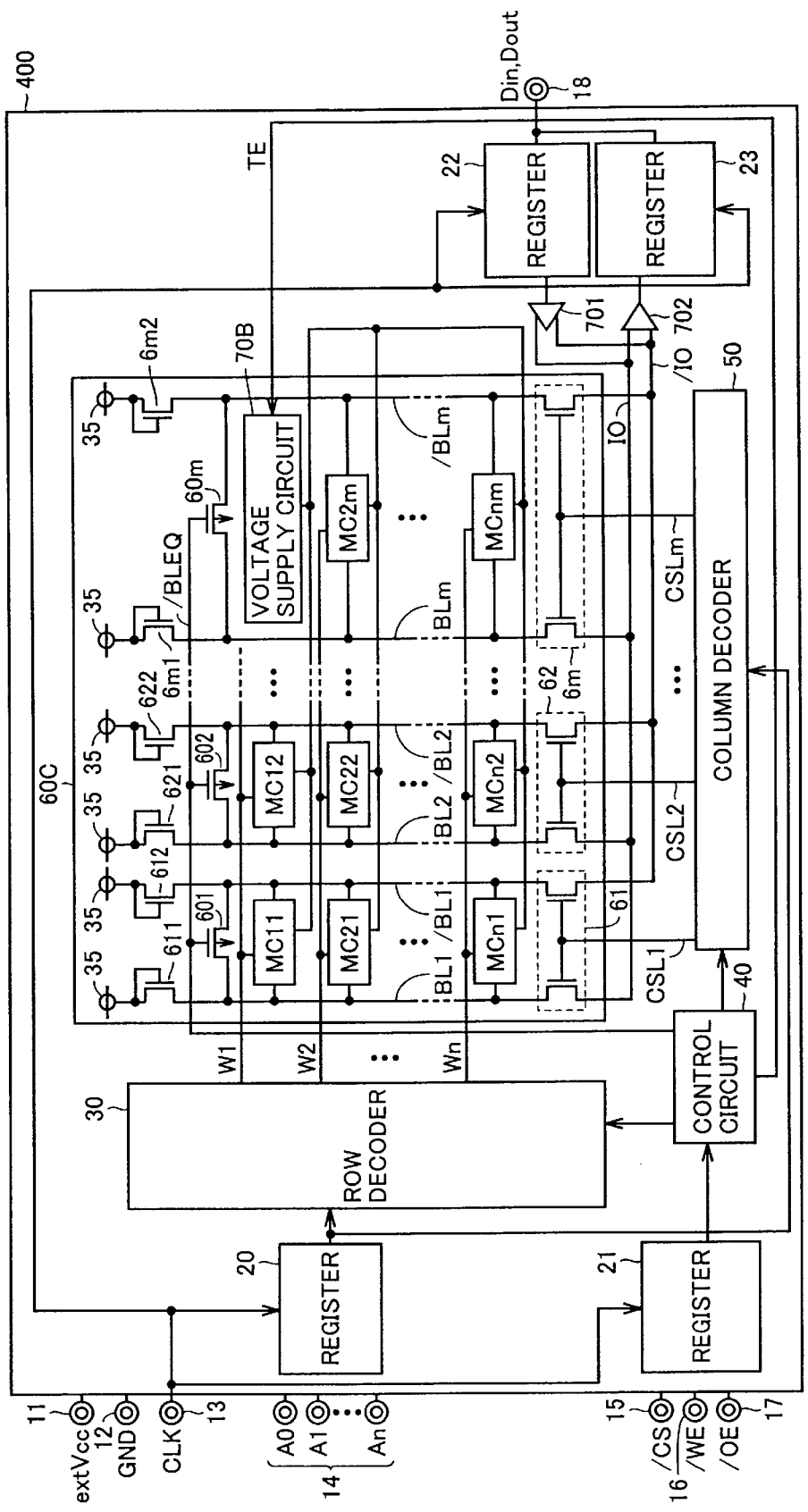
FIG. 20 is a schematic block diagram of a static semiconductor memory device according to a fourth embodiment.

Referring to FIG. 20, a static semiconductor memory device according to a fourth embodiment will be described. A static semiconductor memory device 400 is similar to the static semiconductor memory device 300 in FIG. 12 except that the voltage supply circuit 70B is moved in the memory cell array 60 and the memory cell array 60 is replaced by a memory cell array 60C. The memory cell array 60C is obtained by replacing any one of the plurality of memory cells MC11 to MC1m, MC21 to MC2m, . . . , and MCn1 to MCnm arranged in a matrix with the voltage supply circuit 70B.

Figure 21:
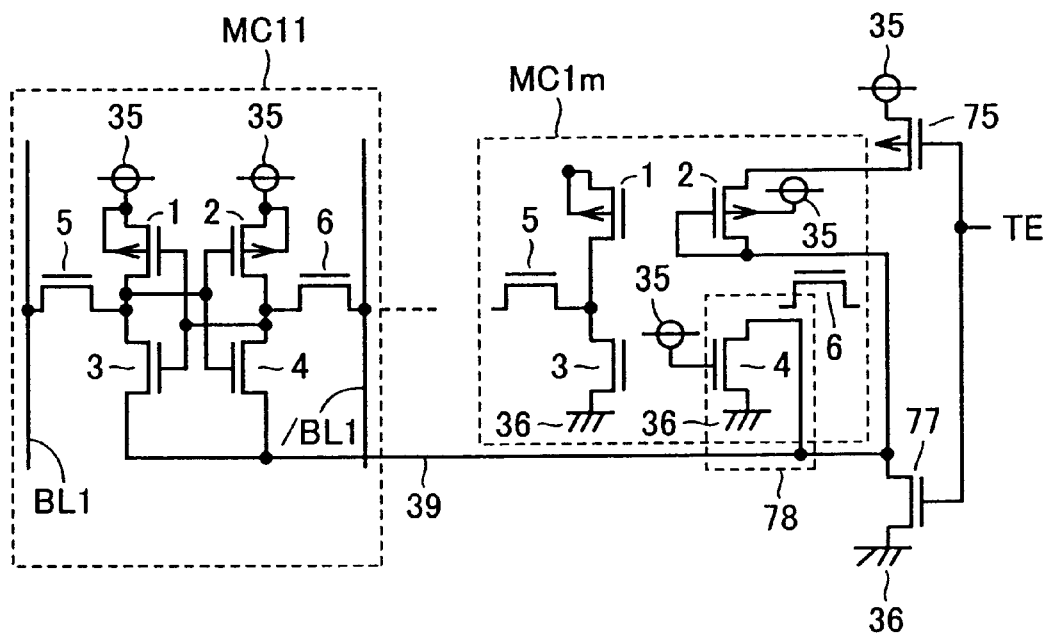
FIG. 21 is a circuit diagram of a voltage supply circuit and memory cells in the static semiconductor memory device shown in FIG. 20.

Referring to FIG. 21, the voltage supply circuit 70B is fabricated by using the p-channel MOS transistor 2 and the n-channel MOS transistor 4 out of the p-channel MOS transistors 1 and 2 and the n-channel MOS transistors 3 to 6 constructing the memory cell MC1m. In this case, the placement of the p-channel MOS transistor 2 and the N-channel MOS transistor 4 is not changed. The p-channel MOS transistor 2 is connected as a diode between the p-channel MOS transistor 75 and the node 39. The n-channel MOS transistor 4 is provided between the ground node 36 and the node 39 and receives the external source voltage extVcc by its gate terminal. In such a manner, the voltage supply circuit 70B is constructed by the p-channel MOS transistors 2 and 75 and the n-channel MOS transistors 4 and 77.

As described above, in the fourth embodiment, without changing the placement of the MOS transistors constructing one of the plurality of memory cells MC11 to MC1m, MC21 to MC2m, . . . , and MCn1 to MCnm, the voltage supply circuit 70B is fabricated. As a result, the p-channel MOS transistors and the n-channel MOS transistors constructing the voltage supply circuit 70B can have the same characteristics as those of the p-channel MOS transistors and the n-channel MOS transistors constructing the memory cells MC11 to MC1m, MC21 to MC2m, . . . , and MCn1 to MCnm. The voltage supply circuit 70B can supply the voltage "extVcc–Vth" to the cell GND lines in the memory cells MC11 to MC1m, MC21 to MC2m, . . . , and MCn1 to MCnm more accurately.

Figure 22:
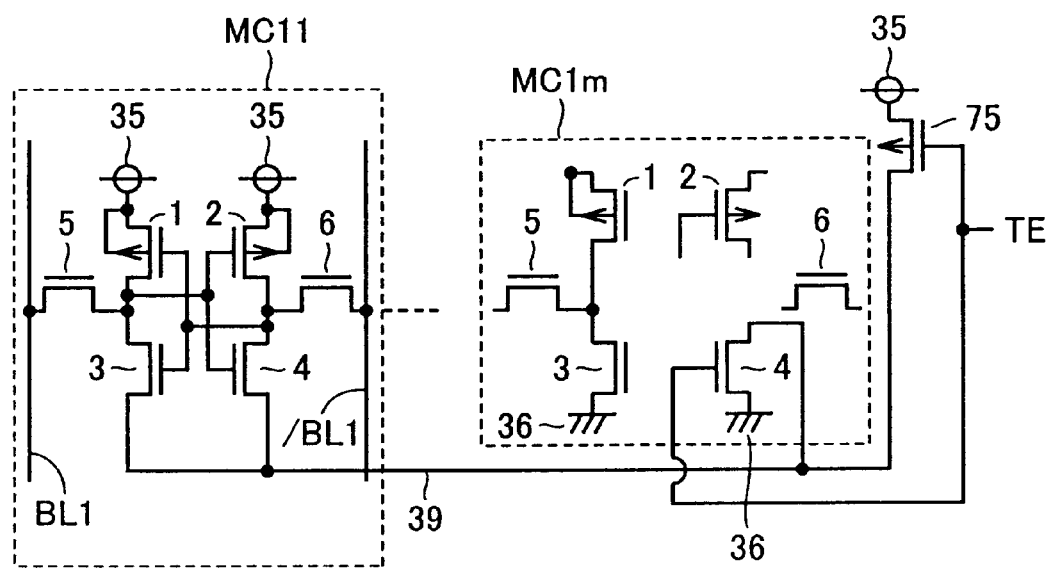
FIG. 22 is a circuit diagram of memory cells in the static semiconductor memory device in FIG. 20, showing another voltage supply circuit.

In the fourth embodiment, it is also possible to form the voltage supply circuit 70C by using one of the memory cells MC11 to MC1m, MC21 to MC2m, . . . , and MCn1 to MCnm. Specifically, referring to FIG. 22, the voltage supply circuit 70C is fabricated by using the n-channel MOS transistor 4 out of the MOS transistors constructing the memory cell MC1m. That is, the voltage supply circuit 70C is fabricated by connecting the drain terminal of the n-channel MOS transistor 4 which has been connected to the p-channel MOS transistor 2, to the node 39.

In the static semiconductor memory device 400 having the memory cell array 60C including the voltage supply circuit 70B or 70C as well, the writing and reading operations of data and the retention test are performed by the same operations as those described in the first embodiment.

It has been described above that each of the voltage supply circuits 70B and 70C is fabricated by using one of the plurality of memory cells MC11 to MC1m, MC21 to MC2m, . . . , and MCn1 to MCnm. The voltage supply circuit 70B or 70C may be fabricated every row by using one of the plurality of memory cells arranged in the row direction. The other is similar to the third embodiment.

According to the fourth embodiment, in the static semiconductor memory device, since the voltage supply circuit for supplying the ground voltage to the memory cells in the normal operation mode, and supplying the voltage "extVcc–Vth" or extVcc to the memory cells in the test mode is fabricated by using one of the plurality of memory cells, even when variations in process or temperature change occur, 0V or the voltage "Vth" can be more accurately applied across each of the plurality of memory cells. Since the voltage supply circuit is formed in a memory cell array, the size of the static semiconductor memory device can be reduced.

In the above description, the retention test of the static memory cell is carried out by applying 0V or the threshold voltage Vth of the MOS transistor across each of the plurality of memory cells MC11 to MC1m, MC21 to MC2m, . . . , and MCn1 to MCnm. In the invention, however, a voltage to be applied across each of the memory cells MC11 to MC1m, MC21 to MC2m, . . . , and MCn1 to MCnm may be in a range from 0V to the threshold voltage Vth. In this case, in the voltage supply circuit 70 shown in FIG. 2, by providing a plurality of n-channel MOS transistors in parallel between the node 38 and the n-channel MOS transistor 74, the voltage supply circuit 70 can supply the voltage in a range from 0V to the threshold voltage Vth to the cell Vcc line of the memory cell MC11. In the circuit diagram shown in FIG. 10, by connecting the n-channel MOS transistor 3 as a component of the memory cell MC1m in parallel with the n-channel MOS transistor 4 between the node 38 and the n-channel MOS transistor 74, the voltage supply circuit 70 can supply the voltage in a range from 0V to the threshold voltage Vth to the cell Vcc line.

Further, by connecting a plurality of p-channel MOS transistors in parallel between the node 39 and the p-channel MOS transistor 74 in the voltage supply circuit 70B shown in FIG. 13, the voltage supply circuit 70B can supply the voltage in the range from the voltage "extVcc–Vth" to the external source voltage extVcc to the cell GND line in the memory cell MC11. Further, in the circuit diagram of FIG. 21, by connecting the p-channel MOS transistor 1 between the p-channel MOS transistor 75 and the node 39 so as to be parallel to the p-channel MOS transistor 2, the voltage supply circuit 70B can supply a voltage in a range from the voltage "extVcc–Vth" to the external source voltage extVcc to the cell GND line of the memory cell MC11.

As described above, according to the embodiments of the invention, the retention test is conducted by applying the voltage in the range from 0V to the threshold voltage of the MOS transistor across a memory cell, so that a memory cell having an abnormal current in the standby mode can be extracted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device comprising:
   a plurality of static memory cells provided between a first node and a second node;
   a control terminal for receiving a control signal;
   a test mode signal generating configured for circuit generating an activated test mode signal when a voltage level of said control signal is equal to or higher than a predetermined level and generating an inactivated test mode signal when said voltage level is lower than said predetermined level; and
   a voltage setting circuit configured for setting a voltage between said first and second nodes to a level of a test voltage in response to said activated test mode signal and setting a voltage between said first and second nodes to a level of an external source voltage in response to said inactivated test mode signal, said external source voltage being supplied from outside said plurality of static memory cells,
   wherein said test voltage lies in a range from 0V to a threshold voltage of a MOS transistor as a component of said memory cell.

2. The static semiconductor memory device according to claim 1, wherein said voltage setting circuit comprises:
   a voltage supply circuit supplying said threshold voltage to said first node in response to said activated test mode signal and supplying said external source voltage to said first node in response to said inactivated test mode signal; and
   a ground voltage supplying terminal supplying a ground voltage to said second node.

3. The static semiconductor memory device according to claim 2, wherein a MOS transistor as a component of said voltage supply circuit has the same shape and placement as those of a MOS transistor included in a memory cell.

4. The static semiconductor memory device according to claim 3, wherein said voltage supply circuit is constructed by using a MOS transistor included in one of said plurality of memory cells.

5. The static semiconductor memory device according to claim 2, wherein said voltage supply circuit comprises:
   a first MOS transistor of a first conduction type provided between an external power source node and said first node;
   second and third MOS transistors of a second conduction type connected in series between said first node and a ground node; and
   a resistive element connected in parallel with said first MOS transistor between said external source node and said first node,
   wherein said first MOS transistor is turned off in response to said activated test mode signal and is turned on in response to said inactivated test mode signal,
   said second MOS transistor is connected as a diode between said first node and said third MOS transistor, and
   said third MOS transistor is turned on in response to said activated test mode signal and is turned off in response to said inactivated test mode signal.

6. The static semiconductor memory device according to claim 5, wherein said resistive element is either a resistor or a MOS transistor of a first conduction type of which resistance value in an ON state is larger than a resistance value in an ON state of said MOS transistor as a component of said memory cell.

7. The static semiconductor memory device according to claim 1, wherein said voltage setting circuit includes:
   a voltage supply circuit supplying a ground voltage to said first node in response to said activated test mode signal and supplying said external source voltage to said first node in response to said inactivated test mode signal, and
   a ground voltage supplying terminal supplying said ground voltage to said second node.

8. The static semiconductor memory device according to claim 7, wherein said voltage supply circuit includes:
   a first MOS transistor of a first conduction type provided between an external source node and said first node; and
   a second MOS transistor of a second conduction type connected between said first node and a ground node,
   said first MOS transistor is turned off in response to said activated test mode signal and is turned on in response to said inactivated test mode signal, and
   said second MOS transistor is turned on in response to said activated test mode signal and is turned off in response to said inactivated test mode signal.

9. The static semiconductor memory device according to claim 1, wherein said voltage setting circuit includes:
   a source voltage supplying terminal supplying said external source voltage to said first node; and
   a voltage supply circuit supplying a voltage obtained by subtracting said threshold voltage from said external source voltage to said second node in response to said activated test mode signal and supplying a ground voltage to said second node in response to said inactivated test mode signal.

10. The static semiconductor memory device according to claim 9, wherein a MOS transistor as a component of said voltage supply circuit has the same shape and placement as those of a MOS transistor included in a memory cell.

11. The static semiconductor memory device according to claim 10, wherein said voltage supply circuit is constructed by using a MOS transistor included in one of said plurality of memory cells.

12. The static semiconductor memory device according to claim 9, wherein said voltage supply circuit comprises:
    first and second MOS transistors of a first conduction type provided in series between an external power source node and said second node;
    a third MOS transistor of a second conduction type provided between said second node and a ground node; and
    a resistive element connected in parallel with said third MOS transistor between said second node and said ground node,
    wherein said first MOS transistor is turned on in response to said activated test mode signal and is turned off in response to said inactivated test mode signal,
    said second MOS transistor is connected as a diode between said first MOS transistor and said first node, and
    said third MOS transistor is turned off in response to said activated test mode signal and is turned on in response to said inactivated test mode signal.

13. The static semiconductor memory device according to claim 12, wherein said resistive element is either a resistor or a MOS transistor of a second conduction type of which resistance value in an ON state is larger than a resistance value in an ON state of said MOS transistor as a component of said memory cell.

14. The static semiconductor memory device according to claim 1, wherein said voltage setting circuit includes:
   a source voltage supplying terminal supplying said external source voltage to said first node; and
   a voltage supply circuit supplying said external source voltage to said second node in response to said activated test mode signal and supplying a ground voltage to said second node in response to said inactivated test mode signal.

15. The static semiconductor memory device according to claim 14, wherein said voltage supply circuit includes:

a first MOS transistor of a first conduction type provided between an external source node and said second node; and a second MOS transistor of a second conduction type connected between said second node and a ground node, said first MOS transistor is turned on in response to said activated test mode signal and is turned off in response to said inactivated test mode signal, and said second MOS transistor is turned off in response to said activated test mode signal and is turned on in response to said inactivated test mode signal.

* * * * *